(12) United States Patent
Yokota et al.

(10) Patent No.: US 7,307,369 B2
(45) Date of Patent: Dec. 11, 2007

(54) SURFACE ACOUSTIC WAVE DEVICE, SURFACE ACOUSTIC WAVE APPARATUS, AND COMMUNICATIONS EQUIPMENT

(75) Inventors: Yuuko Yokota, Soraku-gun (JP); Motoki Ito, Soraku-gun (JP); Shigehiko Nagamine, Soraku-gun (JP); Masayuki Funami, Soraku-gun (JP); Kiyohiro Iioka, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/212,504

(22) Filed: Aug. 26, 2005

(65) Prior Publication Data

US 2006/0043822 A1    Mar. 2, 2006

(30) Foreign Application Priority Data

Aug. 26, 2004  (JP) .............................. 2004-247510
Oct. 26, 2004  (JP) .............................. 2004-311245

(51) Int. Cl.
*H01L 41/04* (2006.01)
(52) U.S. Cl. ................................. 310/313 R
(58) Field of Classification Search ............ 310/313 R, 310/313 A, 313 B, 313 C, 313 D
See application file for complete search history.

(56) References Cited

U.S. PATENT DOCUMENTS

| 5,554,960 | A  | * | 9/1996  | Ohnuki et al. ............... 333/132 |
| 5,773,917 | A  |   | 6/1998  | Satoh et al. |
| 6,297,580 | B1 |   | 10/2001 | Takayama et al. |
| 6,566,983 | B2 | * | 5/2003  | Shin ............................. 333/193 |
| 6,869,815 | B2 | * | 3/2005  | Gasparyan et al. ............ 438/29 |
| 7,067,956 | B2 | * | 6/2006  | Imai et al. ............... 310/313 D |
| 2004/0100164 | A1 | * | 5/2004  | Murata et al. ............... 310/348 |
| 2004/0189146 | A1 | * | 9/2004  | Ueda et al. ............. 310/313 A |
| 2004/0189147 | A1 | * | 9/2004  | Ito et al. ................. 310/313 B |
| 2004/0232804 | A1 | * | 11/2004 | Kita ........................... 310/358 |
| 2004/0245891 | A1 | * | 12/2004 | Kawachi et al. ........ 310/313 R |
| 2005/0285699 | A1 | * | 12/2005 | Yokota et al. ............... 333/133 |

FOREIGN PATENT DOCUMENTS

| JP | 04-293310 | 10/1992 |
| JP | 04-313906 | 11/1992 |
| JP | 07-122961 | 5/1995 |
| WO | WO99/54995 | 10/1999 |

OTHER PUBLICATIONS

Akinori Miyamoto et al., "Novel Optical Observation Technique for Shear Horizontal Wave in SAW resonators on 42°YX-Cut Lithium Tantalate", 2002 IEEE Ultrasonics Symposium, pp. 89-92.

* cited by examiner

*Primary Examiner*—Darren Schuberg
*Assistant Examiner*—Derek Rosenau
(74) *Attorney, Agent, or Firm*—Hogan & Hartson LLP

(57) ABSTRACT

An IDT electrode 3, and an input electrode section 5 and an output electrode section 6 each connecting with the IDT electrode 3 are formed in a filter region on one main surface of a piezoelectric substrate 2, and a semiconductor layer 22 is formed on the other main surface opposite to the one main surface of the piezoelectric substrate 2. The semiconductor layer 22 makes it possible to prevent pyroelectric destruction in the device manufacturing process as well as to prevent out-of-band attenuation characteristics from being degraded.

20 Claims, 22 Drawing Sheets

※MNW: MATCHING NETWORK

※MNW: MATCHING NETWORK

SURFACE ACOUSTIC WAVE DEVICE, SURFACE ACOUSTIC WAVE APPARATUS, AND COMMUNICATIONS EQUIPMENT

BACKGROUND OF THE INVENTION

1. Field of the Invention

The present invention relates to a surface acoustic wave device having a face-down mounting structure, and particularly, to a surface acoustic wave device whose out-of-pass band attenuation is improved, a surface acoustic wave apparatus, and communications equipment using the surface acoustic wave apparatus.

2. Description of Related Art

In recent years, surface acoustic wave filters have been employed for various types of communications equipment.

As the frequency and the function of the communications equipment have increased, a request to increase the out-of-band attenuation of the surface acoustic wave filter has progressively increased.

A schematic sectional view of a face-down mounting structure of a conventional surface acoustic wave device is illustrated in FIG. 25.

In FIG. 25, reference numeral 51 denotes a piezoelectric substrate, reference numeral 52 denotes a ground pad, reference numeral 53 denotes an IDT (Inter Digital Transducer) electrode (referred to as an IDT electrode) in a comb shape formed on the piezoelectric substrate 51, reference numeral 54 denotes a conduction pattern formed on a package (mounting substrate) 57, and reference numeral 55 denotes a connecting bump, and reference numeral 59 denotes a conductor layer formed on a reverse surface (a surface opposite to a surface on which the IDT electrode is formed) of the piezoelectric substrate 51.

In the configuration shown in FIG. 25, the ground pad 52 and the IDT electrode 53 are formed of an Al—Cu film, for example, and the conduction pattern 54 and the ground pad 52 are electrically connected to each other by the bump 55 composed of Au, for example. Further, a cover 56 is further subjected to seam welding or the like through a joint layer 58, thereby sealing the package 57 to maintain the internal airtightness of the surface acoustic wave apparatus accommodating a surface acoustic wave device.

The main cause of degradation of an out-of-band attenuation in the conventional surface acoustic wave apparatus having such a face-down structure is, for example, input-output electromagnetic coupling due to an increase in electrical resistance of an electrode such as the ground pad 52, the IDT electrode 53, the conductor pattern 54 formed on the package 57, etc. in the surface acoustic wave device, a parasitic inductance, or a stray capacitance.

The input-output electromagnetic coupling due to the stray capacitance will be particularly described.

The surface acoustic wave device is a device using a comb-shaped IDT electrode produced on a piezoelectric substrate. Generally, a piezoelectric substance exhibits pyroelectric properties due to a rapid temperature change. When a device having an IDT electrode on a piezoelectric substrate is passed through a step in which there is a rapid temperature change while being manufactured, sparks are generated between electrode sections in the IDT electrode, thereby destroying the device. In order that charges may be stored in the piezoelectric substrate as little as possible, therefore, a conductor layer 59 is generally formed throughout the reverse surface of the piezoelectric substrate.

Although the conductor layer 59 is effective in preventing pyroelectric destruction during the element manufacturing process, however, the inventors found that a capacitive coupling occurs between the conductor layer 59 and the input/output electrodes of the IDT electrode 53, which deteriorates the out-of-band attenuation.

In particular, a branching filter (a duplexer) for isolating a signal in a transmission-side frequency band (e.g., a low frequency-side frequency band) and a signal in a receiving-side frequency band (e.g., a high frequency-side frequency band) in the surface acoustic wave apparatus will be described in detail.

The branching filter is referred to as a surface acoustic wave duplexer (hereinafter abbreviated as an SAW-DPX).

In the SAW-DPX, a filter in the transmission-side frequency band (hereinafter referred to as a transmission-side filter) and a filter in the receiving-side frequency band (hereinafter referred to as a receiving-side filter) are formed on the same surface of the same piezoelectric substrate to achieve miniaturization.

When the transmission-side filter and the receiving-side filter are actually formed on the same piezoelectric substrate, however, isolation characteristics between both filters cannot satisfy requirement specifications in a communications terminal.

The isolation characteristics mean the level of a signal leakage from one filter to the other filter. Such a signal leakage must be minimized.

Particularly in the branching filter, when a high-power transmission signal amplified on the transmission side leaks from the transmission-side filter to the receiving-side filter to leak to the receiving side, an originally low-power receiving signal cannot be received.

In specifications of the isolation characteristics required for the branching filter, therefore, it is required that a signal leakage is significantly minimized. This requirement is significantly stricter than the requirement of specifications for a Dual-SAW filter employed between stages.

It is considered that one cause of degradation of the isolation characteristics between the filters is leakage of an elastic wave. Particularly in the SAW-DPX, it is considered that an elastic wave excited in an IDT electrode forming the transmission-side filter cannot be sufficiently trapped in the IDT electrode, and the elastic wave that has leaked from the IDT electrode in the transmission-side filter propagates on the surface of the piezoelectric substrate and is received by an IDT electrode forming the receiving-side filter so that the signal leaks from the transmission-side filter to the receiving-side filter, thereby degrading the isolation characteristics (Akinori Miyamoto, Shin-ichi Wakana, and Akio Ito, Fujitsu Laboratories Limited, "Novel optical observation technique for shear horizontal wave in SAW resonators on 42° YX-cut lithium tantalate" 2002 IEEE ULTRASONICS SYMPOSIUM-89).

Specifically, a propagation path of a surface acoustic wave from the IDT electrode in the transmission-side filter and a propagation path of a surface acoustic wave from the IDT electrode in the receiving-side filter are arranged so as to be overlapped with each other on the same straight line. Therefore, it is considered that the surface acoustic wave leaks from the IDT electrode in the transmission-side filter to the IDT electrode in the receiving-side filter, thereby degrading the isolation characteristics.

Therefore, an attempt has been made to improve the isolation characteristics by respectively separating the transmission-side filter and the receiving-side filter that have been formed on the same piezoelectric substrate and forming the filters on separate piezoelectric substrates to cut off the propagation of the leakage of the surface acoustic wave.

In such an attempt, the isolation characteristics are improved. However, the transmission-side filter and the receiving-side filter that have been originally integrally formed are separated and formed on the separate piezoelectric substrates. In a case where the transmission-side filter and the receiving-side filter are mounted on a mounting substrate, therefore, the area of a region serving as a branching filter is larger than that in a case where the transmission-side filter and the receiving-side filter are integrally formed on the same piezoelectric substrate. Therefore, it is impossible to fulfill a miniaturization requirement.

Therefore, it is also considered that the respective IDT electrodes in the transmission-side filter and the receiving-side filter are arranged such that the propagation paths of the surface acoustic wave from both IDT electrodes are parallel to each other, for example, so as not to be overlapped with each other. It should be possible to provide a small-sized SAW-DPX having improved isolation characteristics while forming the transmission-side filter and the receiving-side filter on the same piezoelectric substrate to achieve miniaturization without separating the filters on the separate piezoelectric substrates.

When the inventors of the present invention conducted detailed experiments, however, the isolation characteristics were not improved. This means that the degradation of the isolation characteristics does not result only from the leakage of the surface acoustic wave.

The inventors of the present invention found that the above-mentioned surface conductor layer 59 is effective in preventing pyroelectric destruction during the device manufacturing process but is harmful for the isolation characteristics of the surface acoustic wave device.

If the surface conductor layer 59 and the ground electrode in the package 57 are conducted by wiring, therefore, capacitive coupling between the input and output electrode sections in each of the filters can be reduced to some extent. However, this measure does not sufficiently improve the isolation characteristics.

Furthermore, when the IDT electrode formation surface of the piezoelectric substrate and the main surface of the package 57 are opposed to each other to perform mounting (flip-chip mounting) with a vibration space ensured therebetween, it is advantageous in miniaturization. However, the surface conductor layer 59 on the reverse surface of the piezoelectric substrate is spaced apart from the main surface of the package 57 that can be at a ground potential. Therefore, extra steps are required to ground a portion from the surface conductor layer 59 to the ground electrode on the main surface of the package 57, thereby increasing manufacturing costs.

An object of the present invention is to provide a surface acoustic wave device capable of improving the out-of-band attenuation of a filter, having a high yield, and being superior in reliability, a surface acoustic wave apparatus, and communications equipment using the surface acoustic wave apparatus.

Another object of the present invention is particularly to provide a surface acoustic wave device, in which a transmission-side filter and a receiving-side filter are formed on the same piezoelectric substrate, having superior isolation characteristics, having a high yield, and being small in size and superior in reliability, a surface acoustic wave apparatus, and communications equipment using the surface acoustic wave apparatus.

SUMMARY OF THE INVENTION

A surface acoustic wave device according to the present invention comprises a piezoelectric substrate having an IDT electrode, and an input electrode section and an output electrode section each connecting with the IDT electrode formed in a filter region on its one main surface; and a semiconductor layer formed on the other main surface opposite to the one main surface of the piezoelectric substrate.

In the surface acoustic wave device, the semiconductor layer formed on the other main surface of the piezoelectric substrate has a frequency characteristics such as being a conductor (a low resistance) in a DC region, while being a layer having sufficiently high-resistance at a frequency in the vicinity of a pass band of a filter.

Such frequency characteristics mainly depend on carrier mobility in the semiconductor layer. The carrier mobility can be set to a desired value by adjusting the crystallinity, the crystal grain diameter, the impurity density, etc. of the semiconductor layer.

According to the surface acoustic wave device in the present invention, the semiconductor layer is formed on the other main surface of the piezoelectric substrate, so that carriers in the semiconductor layer do not easily follow a high-frequency electric field at the frequency in the vicinity of the pass band of the filter. Therefore, capacitive coupling through the other main surface of the piezoelectric substrate does not easily occur between the input electrode section and the output electrode section. Consequently, out-of-pass band attenuation characteristics or isolation characteristics that have been conventionally degraded due to a parasitic capacitance can be improved.

Furthermore, the semiconductor layer is a conductor in a direct current, thereby making it possible to efficiently discharge charges generated in the piezoelectric substrate due to a rapid temperature change in the manufacturing process and to obtain the effect of preventing damage to the electrode such as pyroelectric destruction caused by the pyroelectric properties of the piezoelectric substrate.

According to the surface acoustic wave device in the present invention, therefore, it is possible to obtain both the effect of satisfactorily preventing pyroelectric destruction and the effect of preventing out-of-band attenuation characteristics and isolation characteristics from being degraded.

The semiconductor layer is composed of at least one of the materials selected from silicon, germanium, titanium oxide, zinc oxide, and aluminum nitride, or a material mainly composed of the one of material.

The materials can be formed as a semiconductor layer having optimum carrier mobility by suitably adjusting deposition conditions such as deposition pressure, deposition speed, and deposition temperature using a simple depositing method such as a sputtering method or an evaporation method. The surface acoustic wave device can be so adjusted as to have an optimum conductivity in a DC region by adding impurity elements or adjusting a composition ratio.

According to the surface acoustic wave device in the present invention, the semiconductor layer may be composed of a lithium tantalate single crystal, a lithium niobate single crystal, or a lithium tetraborate single crystal, the oxygen content of which is lower than a stoichiometric composition ratio.

The single crystal can be produced by subjecting a surface of the piezoelectric substrate to reduction treatment before the electrode or the like is produced on the one main surface of the piezoelectric substrate. The single crystal has the property of looking like a conductor in a direct current, while almost looking like an insulator in a frequency band where a surface acoustic wave apparatus is employed, similarly to silicon or the like, described above. Consequently, it is possible to prevent the band pass characteristics of the filter from being degraded, prevent charges from being stored in the IDT electrode, and prevent pyroelectric destruction of the surface acoustic wave device. Moreover, the number of steps in the manufacturing process of the surface acoustic wave apparatus need not be increased.

The piezoelectric substrate may be a composite substrate composed of a piezoelectric material arranged on the one main surface and another material having a lower dielectric constant than that of the piezoelectric material.

In this case, an effective dielectric constant between the input electrode section and the output electrode section in the filter can be reduced, which allows a parasitic capacitance to be also reduced. Consequently, the out-of-band attenuation characteristics and the isolation characteristics of the filter can be further improved. Particularly in a case where carrier mobility in the semiconductor layer cannot be sufficiently reduced even if the formation conditions of the semiconductor layer are adjusted, this configuration is significantly effective.

According to the surface acoustic wave device in the present invention, the semiconductor layer may coat the entire other main surface of the piezoelectric substrate. When the semiconductor layer coats the entire other main surface, it is possible to efficiently discharge charges generated due to a rapid temperature change in the manufacturing process and to obtain the effect of more reliably preventing damage to the electrode such as pyroelectric destruction caused by the pyroelectric properties of the piezoelectric substrate.

The semiconductor layer may be partially formed on the other main surface of the piezoelectric substrate. When the semiconductor layer is partially formed on the other main surface, the formation area of the semiconductor layer can be made smaller, as compared with that in a case where it coats the entire other main surface. Particularly in a case where carrier mobility in the semiconductor layer cannot be sufficiently reduced even if the formation conditions of the semiconductor layer are adjusted, this configuration is very effective. Consequently, degradation of out-of-pass band attenuation characteristics and isolation characteristics that have been conventionally degraded due to a parasitic capacitance can be greatly improved.

It is desirable that the surface roughness of a region where the semiconductor layer is not formed on the other main surface of the piezoelectric substrate is increased. A surface acoustic wave excited by the IDT electrode propagates in the piezoelectric substrate after its part is converted into a bulk wave, and is reflected on a reverse surface of the piezoelectric substrate to reach a surface of the piezoelectric substrate again. Therefore, the propagation of the bulk wave inside the piezoelectric substrate can be reliably restrained by increasing the surface roughness of the region where the semiconductor layer is not formed on the other main surface of the piezoelectric substrate. Consequently, an amount of degradation by the propagation of the bulk wave out of degradation factors of the out-of-band attenuation characteristics can be also effectively reduced.

A surface acoustic wave device according to the present invention is also applicable to a device in which a filter region comprises a transmission-side filter region and a receiving-side filter region, that is, a branching filter (a duplexer) for separating a signal in a transmission-side frequency band and a signal in a receiving-side frequency band.

The degradation of the isolation characteristics in the branching filter is caused by capacitive-coupling through a conductor layer generally formed over the entire other main surface of the piezoelectric substrate between an input electrode in a transmission-side filter (e.g., a low-frequency side filter) and an output electrode in a receiving-side filter (e.g., a high-frequency side filter) formed on the one main surface of the piezoelectric substrate.

An effect in a case where the present invention is applied to the branching filter will be described using the results of simulation and a conceptual diagram of a circuit used for the simulation.

FIG. 17(a) is a circuit diagram of communications equipment in a case where there is no parasitic capacitance, FIG. 17(b) is a graph showing an example of its isolation characteristics, 17(c) is a circuit diagram of communications equipment in a case where there is a parasitic capacitance C caused by a conductor layer, and 17(d) is a graph showing an example of its isolation characteristics.

The parasitic capacitance C shown in FIG. 17(c) is a parasitic capacitance existing between an input electrode section in a transmission-side filter and an output electrode section in a receiving-side filter and is a very small parasitic capacitance of approximately 50 fF (femto=$10^{-15}$).

As apparent from comparison between FIGS. 17(b) and 17(d), signal intensities at 869 MHz to 894 MHz are −30 dB to −40 dB as shown in FIG. 17(d) when there is such a parasitic capacitance C, while being not more than −50 dB as shown in FIG. 17(b) when there is no parasitic capacitance. It is found that isolation characteristics are greatly improved because there is no parasitic capacitance.

In a case where a lithium tantalate single crystal substrate having a thickness of 250 μm, for example, is used as the piezoelectric substrate, such a parasitic capacitance of approximately 50 fF corresponds to a capacitance formed in a case where respective electrodes in the shape of a square whose one side is approximately 180 μm on a surface and a reverse surface of the piezoelectric substrate are opposed to each other when it is calculated, taking its dielectric constant as 42.7. Generally, the area of the input-output electrode sections in the surface acoustic wave filter is of this degree. Therefore, it can be said that a value inserted as the parasitic capacitance C by simulation is a value on which reality is reasonably reflected.

It is the parasitic capacitance C between the input electrode section in the transmission-side filter and the output electrode section in the receiving-side filter, herein described, that most greatly affects the isolation characteristics. However, there is also a parasitic capacitance between a connection electrode for connecting IDT electrodes in each of the filters and the input-output electrode sections in the filter, and there is also a parasitic capacitance between a connection electrode for connecting IDT electrodes in one of the filters and a connection electrode for connecting IDT electrodes in the other filter. The parasitic capacitances similarly degrade the isolation characteristics.

Therefore, the transmission-side filter and the receiving-side filter can be integrally formed on the same piezoelectric substrate by forming a semiconductor layer on the reverse surface (the other main surface) of the piezoelectric substrate to improve the isolation characteristics between the transmission-side filter and the receiving-side filter.

Thus, it is possible to produce an SAW-DPX (Surface Acoustic Wave-Duplexer) that is smaller in size than a surface acoustic wave device in which a transmission-side filter and a receiving-side filter are respectively formed on separate piezoelectric substrates. The input electrode section in the transmission-side filter and the output electrode section in the receiving-side filter are hardly capacitive-coupled through a semiconductor layer on the other surface. Therefore, it is possible to obtain a surface acoustic wave device whose isolation characteristics are not degraded, although it is a small-sized SAW-DPX, and to prevent pyroelectric destruction of the surface acoustic wave device in the manufacturing process.

It is desirable that the surface roughness of a region where the semiconductor layer is not formed on the other main surface of the piezoelectric substrate is higher than the surface roughness of a region where the semiconductor layer is formed. When a bulk wave generated in the transmission-side filter on the basis of a transmission signal having a high power amplified on the transmission side does not easily leak to the receiving-side filter, so that the isolation characteristics of the surface acoustic wave device can be improved.

A surface acoustic wave apparatus according to the present invention comprises the above-mentioned surface acoustic wave device and a mounting substrate, the piezoelectric substrate having the filter region formed therein being mounted (flip-chip mounted) on the mounting substrate with the one main surface thereof (a formation surface of the IDT electrode) opposed thereto.

From a recent request to reduce the sizes/the heights of components, the surface acoustic wave apparatus is also required to reduce the thickness of the piezoelectric substrate. However, the thinner the piezoelectric substrate becomes, the higher a capacitance between the electrode on the one main surface and the conductor layer on the other main surface becomes. Consequently, the degradation of the isolation characteristics caused by the capacitive coupling through the parasitic capacitance further grows into a serious problem. Contrary to this, the semiconductor layer is formed on the other main surface, thereby making it possible to obtain a surface acoustic wave apparatus being thin and having good isolation characteristics.

If the surface acoustic wave apparatus has a configuration in which an annular conductor is formed so as to surround the filter region on the one main surface of the piezoelectric substrate, and the annular conductor is joined to a substrate-side annular conductor formed so as to correspond thereto on the mounting substrate, the surface acoustic wave device can be mounted on the mounting substrate by joining the annular conductor and the substrate-side annular conductor to each other firmly and in a state where the IDT electrode and the input electrode section and the output electrode section are hermetically sealed. When the semiconductor layer on the other main surface of the piezoelectric substrate is processed after the surface acoustic wave device is mounted on the mounting substrate, therefore, the semiconductor layer can be processed without damaging the IDT electrode and others formed on the one main surface of the piezoelectric substrate. The shape of the annular conductor may be a shape separately surrounding the transmission-side filter region and the receiving-side filter region, or may be a shape surrounding both the filter regions.

When the IDT electrode is electrically connected to the annular conductor through a resistor, and the annular conductor is at a ground potential, the IDT electrode is at a ground potential in a DC manner, while being brought into a state where it is almost insulated from the ground potential in a frequency band where the surface acoustic wave apparatus is employed. Therefore, charges can be prevented from being stored in the IDT electrode without affecting the pass band characteristics of the filter. Even if the semiconductor layer is not formed on the entire other main surface of the piezoelectric substrate, pyroelectric destruction of the surface acoustic wave apparatus can be reliably prevented.

Since the surface acoustic wave apparatus according to the present invention is small in size, although it has good out-of-band attenuation characteristics or isolation characteristics, the surface acoustic wave apparatus can be suitably used as a circuit component of a receiving circuit or a transmission circuit in communications equipment.

The above-mentioned surface acoustic wave apparatus according to the present invention is used as a branching filter in communications equipment, whereby strict isolation characteristics that have been required of the branching filter can be satisfied. Further, since the surface acoustic wave apparatus is small in size, therefore, the mounting areas of other components can be increased, and options for the components is broadened, thereby making it possible to realize high-functional communications equipment.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the following drawings, the size of each of electrodes, the distance between the electrodes, the number of electrode fingers, spacing between the electrode fingers, and the like are schematically illustrated for description and therefore, the present invention is not limited to the same.

DETAILED DESCRIPTION OF PREFERRED EMBODIMENTS

<Surface Acoustic Wave Device and Apparatus>

Figure 1:
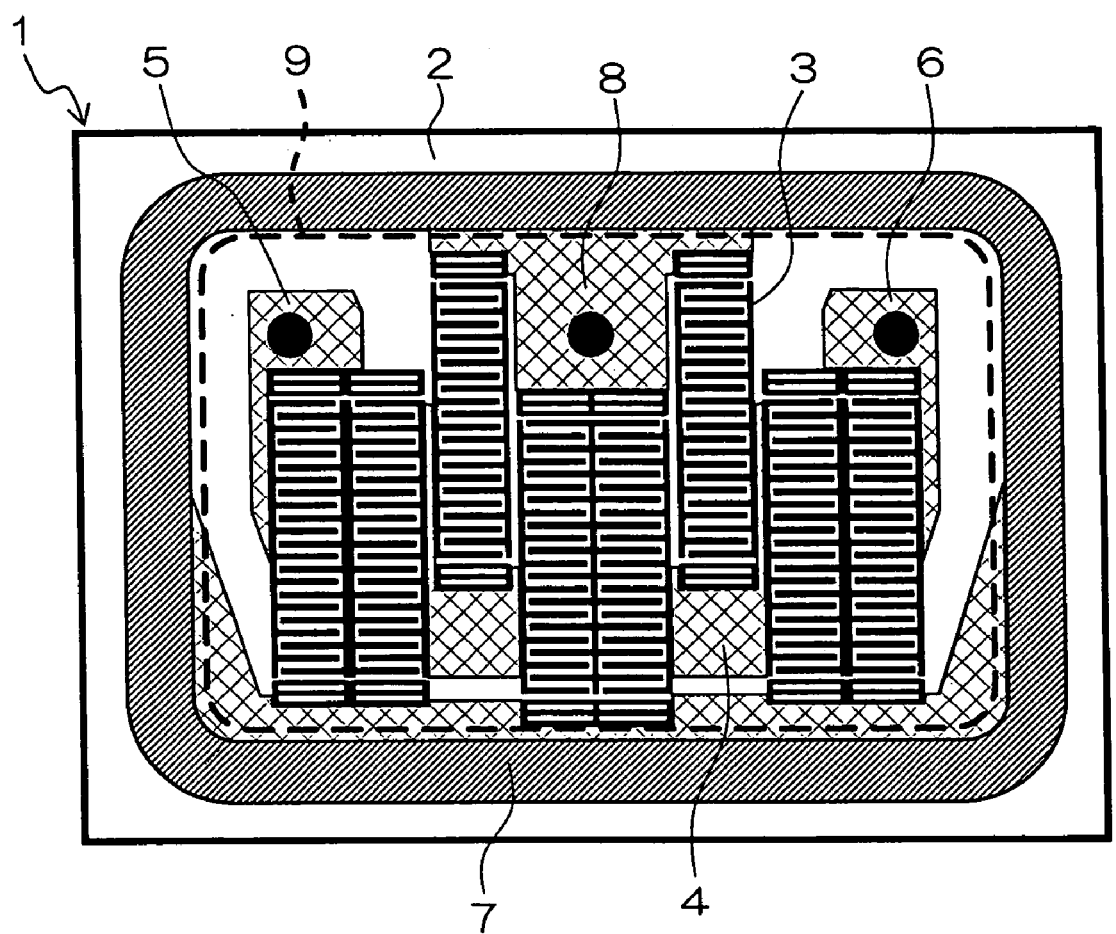
FIG. 1 is a plan view showing one main surface of a piezoelectric substrate having a surface acoustic wave device according to the present invention formed therein.

FIG. 1 is a plan view showing one main surface of a piezoelectric substrate having a surface acoustic wave device according to the present invention formed therein.

FIG. 2(a) is a cross-sectional view of the surface acoustic wave device. FIG. 2(b) is a bottom view showing a surface (referred to as the other main surface), opposite to a surface where IDT electrodes and others are formed (an IDT electrode formation surface) (referred to as one main surface), of the surface acoustic wave device.

Figure 3:
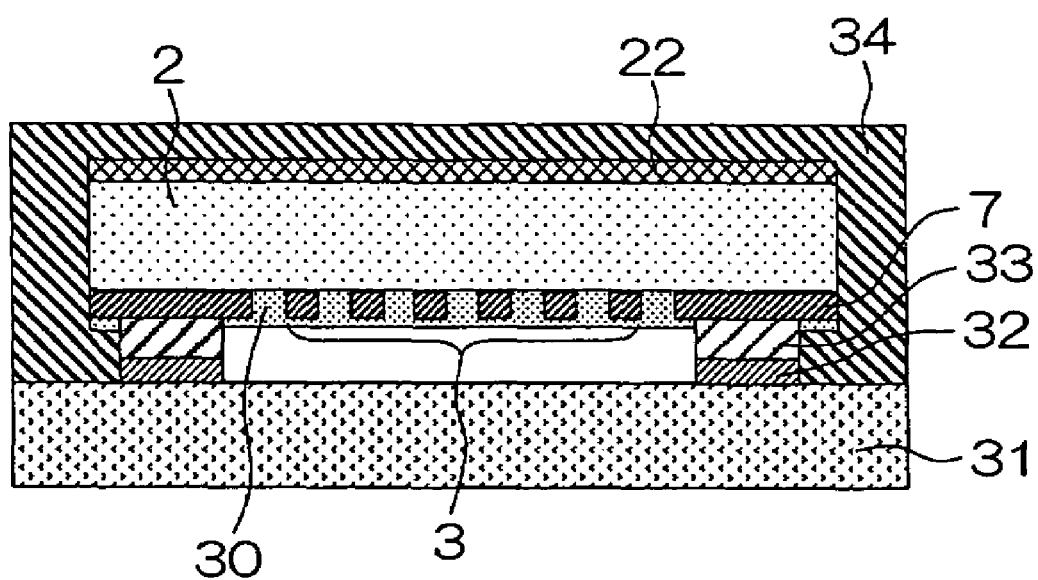
FIG. 3 is a cross-sectional view of a surface acoustic wave apparatus according to the present invention having one filter formed therein.

FIG. 3 is a cross-sectional view of a surface acoustic wave apparatus on which the surface acoustic wave device is mounted.

As shown in FIG. 1, a filter region 9 is formed on an IDT electrode formation surface of a piezoelectric substrate 2. A plurality of IDT electrodes 3 composing a ladder-type filter, a connection electrode 4 for connecting the IDT electrodes 3, and an input electrode section 5 and an output electrode section 6 that are electrically connected to the IDT electrodes 3 so as to connect a surface acoustic wave device 1 and a mounting substrate 31 are formed in the filter region 9.

Reference numeral 7 denotes an annular conductor in a square frame shape formed so as to surround the IDT electrodes 3, the connection electrode 4, the input electrode section 5, the output electrode section 6, and a ground electrode 8 (hereinafter referred to as "IDT electrodes and others"). Reference numeral 8 denotes a ground electrode. The ground electrode 8 is connected to the annular conductor 7.

The annular conductor 7 is connected to a substrate-side annular conductor 32 in the mounting substrate 31 using a solder or the like, to function as a ground electrode in a surface acoustic wave filter as well as to have the function of sealing a space between the piezoelectric substrate 2 and the mounting substrate 31.

In the surface acoustic wave device 1, a semiconductor layer 22 shown in FIGS. 2(a), 2(b), and 3 is formed on the other main surface of the piezoelectric substrate 2.

The semiconductor layer 22 makes it possible to reduce capacitive coupling between the input electrode section 5 and the output electrode section 6 in the filter region 9 through a parasitic capacitance, thereby allowing the out-of-band attenuation characteristics of the surface acoustic wave device 1 to be improved.

Although in this example, the annular conductor 7 is utilized as the ground electrode in the surface acoustic wave device 1, the annular conductor 7 may not be used as the ground electrode. Alternatively, the ground electrode 8 in the surface acoustic wave device 1 may be directly connected to a ground electrode in the mounting substrate 31.

The surface acoustic wave device 1 is mounted on the mounting substrate 31 with the one main surface of the piezoelectric substrate 2, described above, opposed to an upper surface of the mounting substrate 31, as shown in FIG. 3, thereby constituting the surface acoustic wave apparatus.

In FIG. 3, the mounting substrate 31 is a circuit board on which the surface acoustic wave device 1 is to be mounted. An input terminal and an output terminal respectively corresponding to the input electrode section 5 and the output electrode section 6 in the surface acoustic wave device 1 and a ground terminal (none of which are shown), and the substrate-side annular conductor 32 corresponding to the annular conductor 7 are formed on an upper surface of the mounting substrate 31. Reference numeral 33 denotes a brazing material such as a solder for joining the annular conductor 7 and the substrate-side annular conductor 32.

Figure 4:
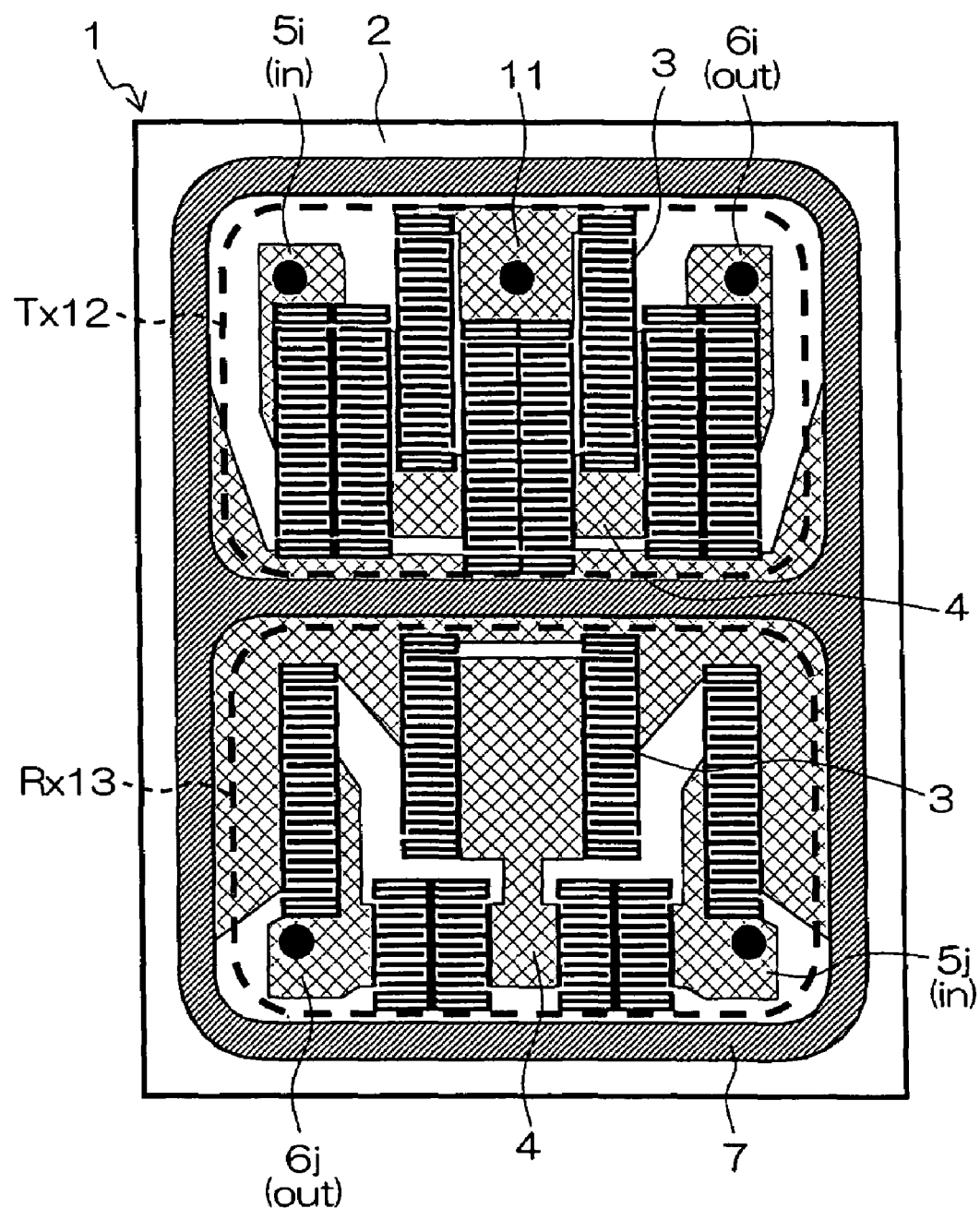
FIG. 4 is a plan view showing one main surface of a surface acoustic wave device having a transmission-side filter and a receiving-side filter formed therein.

FIG. 4 is a plan view showing one main surface of another surface acoustic wave device 1 manufactured according to the present invention.

The surface acoustic wave device 1 is an example in which two ladder-type surface acoustic wave devices are used, to constitute a duplexer. Two filter regions are formed, respectively constituting a transmission-side filter and a receiving-side filter.

As shown in FIG. 4, a transmission-side filter region 12 and a receiving-side filter region 13 are formed on a piezoelectric substrate 2. A plurality of IDT electrodes 3 and a connection electrode 4 for connecting the IDT electrodes 3, and an input electrode section 5i and an output electrode section 6i that are electrically connected to the IDT electrodes 3 so as to connect the surface acoustic wave device 1 and a mounting substrate (not shown) are formed in the transmission-side filter region 12.

Similarly, a plurality of IDT electrodes 3 and a connection electrode 4 for connecting the IDT electrodes 3, and an input electrode section 5j and an output electrode section 6j that are electrically connected to the IDT electrodes 3 so as to connect the surface acoustic wave device 1 and the mounting substrate are formed in the receiving-side filter region 13.

An annular conductor 7 is formed so as to individually surround the transmission-side filter region 12 and the receiving-side filter region 13. The annular conductor 7 is connected to a substrate-side annular conductor formed so as to correspond thereto on an upper surface of the mounting substrate using a solder or the like.

In this example, the annular conductor 7 is integrally formed so as to individually surround the transmission-side filter region 12 and the receiving-side filter region 13, to function as a ground electrode in a receiving-side filter composed of the receiving-side filter region 13 as well as to have the function of separately sealing the transmission-side filter region 12 and the receiving-side filter region 13 between the piezoelectric substrate 2 and the mounting substrate.

In the surface acoustic wave device 1, a semiconductor layer is also formed on the other main surface of the piezoelectric substrate 2. This allows capacitive coupling between the input electrode section 5i in the transmission-side filter region 12 and the output electrode section 6j in the receiving-side filter region 13 through a parasitic capacitance to be reduced, thereby allowing the isolation characteristics of the surface acoustic wave device 1 to be improved.

In this example, the ground electrode 11 in the transmission-side filter is not connected to the annular conductor 7 on the piezoelectric substrate 2. The transmission-side filter is grounded by connecting the ground electrode 11 to a ground electrode in the mounting substrate using a solder bump or the like. Particular when the pass band of the transmission-side filter is positioned on the lower frequency side than the pass band of the receiving-side filter, a configuration in which the ground electrode 11 in the transmission-side filter is not connected to the annular conductor 7 is desirable in obtaining a high attenuation at a frequency corresponding to the pass band of the receiving-side filter on the high-frequency side in the bass band of the transmission-side filter.

Conversely, the annular conductor 7 may be used as the ground electrode in the transmission-side filter, and the receiving-side filter may be directly connected to the ground electrode in the mounting substrate. Also GND electrode in the receiving-side filter may be directly connected to the ground electrode in the mounting substrate without using the annular conductor 7 as the ground electrode, as in the transmission-side filter.

Figure 5:
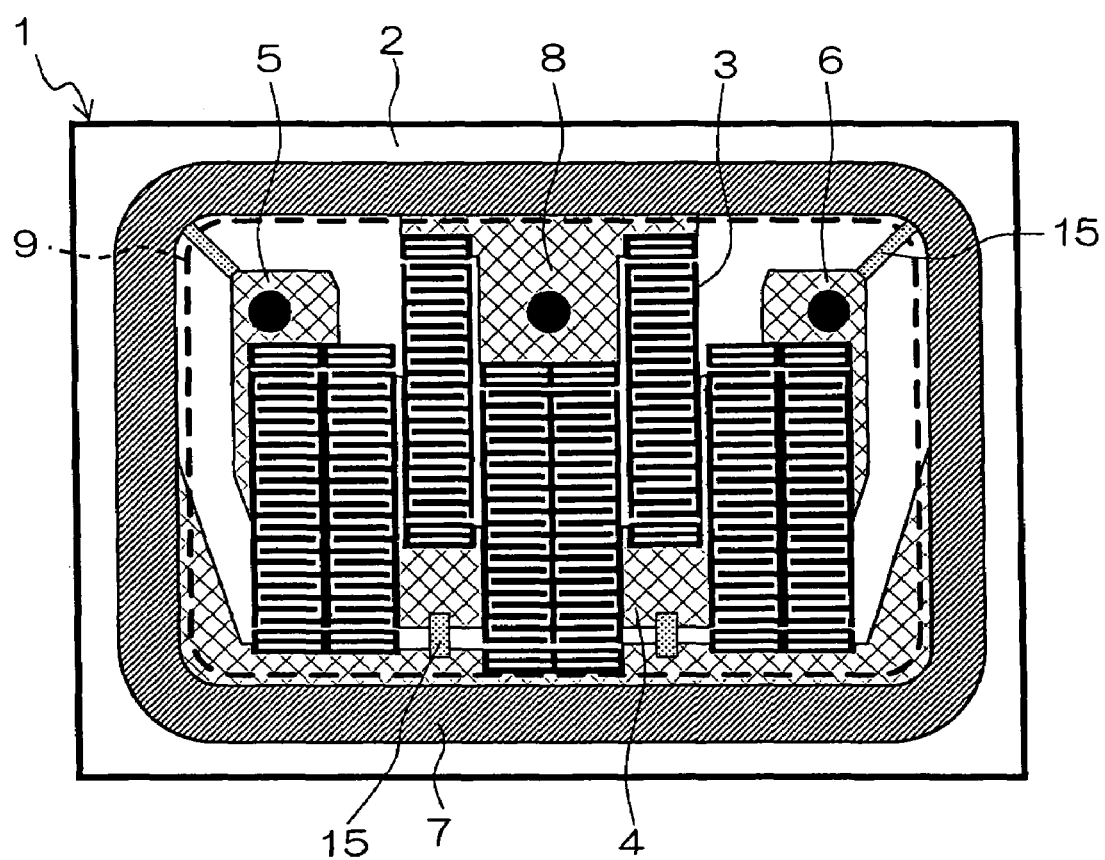
FIG. 5 is a plan view showing one main surface of a piezoelectric substrate in another surface acoustic wave device having one filter formed therein.

FIG. 5 is a plan view showing one main surface of a piezoelectric substrate 2 in still another example of a surface acoustic wave device 1.

In this example, on the side of the one main surface of the piezoelectric substrate 2, each of IDT electrodes 3 and an annular conductor 7 are connected to each other through a resistor 15 such that the IDT electrode 3 is rendered non-conductive to the annular electrode 7 in a high-frequency manner, while being rendered conductive thereto in a DC manner. The annular electrode 7 is at a ground potential by being connected to a substrate-side annular conductor.

Figure 6:
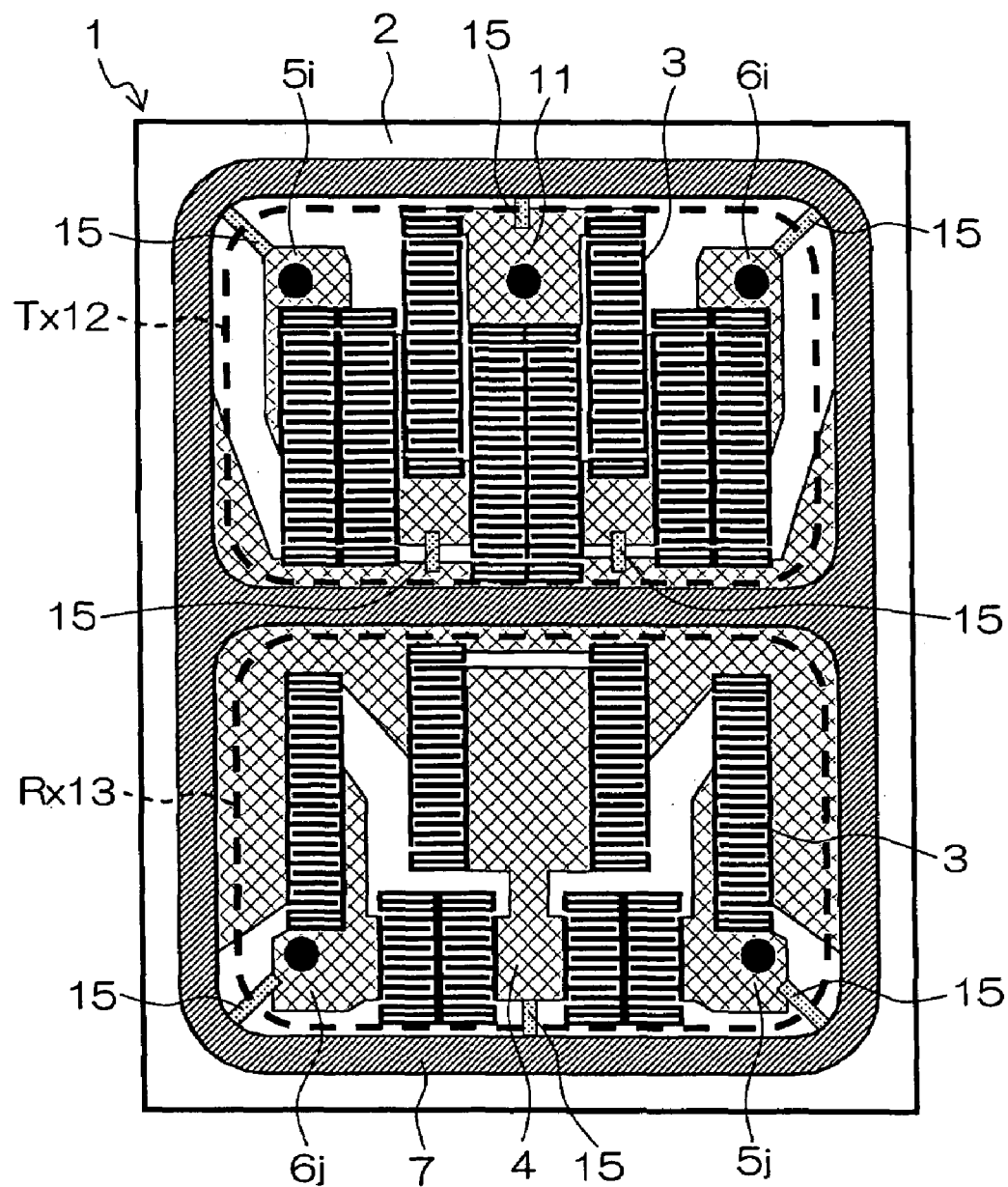
FIG. 6 is a plan view showing one main surface of a piezoelectric substrate in still another surface acoustic wave device having a transmission-side filter and a receiving-side filter formed therein.

Furthermore, FIG. 6 is a plan view showing one main surface of a piezoelectric substrate 2 in a surface acoustic wave device 1 having two filter regions formed therein.

Also in this example, each of IDT electrodes 3 and an annular conductor 7 are connected to each other through a resistor 15 in each of the two filter regions on the one main surface of the piezoelectric substrate 2. Further, the annular conductor 7 is at a ground potential by being connected to a substrate-side annular conductor.

Thus, the IDT electrode 3 is electrically connected to the annular conductor 7 through the resistor 15. The annular conductor 7 is at a ground potential. This allows charges to be discharged to a ground electrode in a mounting substrate from the one main surface of the piezoelectric substrate 2, thereby making it possible to effectively prevent pyroelectric destruction of the surface acoustic wave device 1.

The resistor 15 has a sufficiently high resistance in a frequency band in which a filter is used, to select a resistance value at which it almost looks like an insulator. High-resistance semiconductors such as silicon and titanium oxide are suitably used as materials for the resistor 15. The resistance value of the material can be controlled to a proper value by adding thereto an element such as boron in small amounts or adjusting the composition ratio thereof.

<Manufacturing Method>

Here, description is made of a method of manufacturing the surface acoustic wave device.

Usable as the piezoelectric substrate 2 are a lithium tantalate single crystal, a lithium niobate single crystal, a lithium tetraborate single crystal, etc.

Furthermore, a single layer film composed of aluminum, an aluminum alloy, copper, a copper alloy, gold, a gold alloy, tantalum, a tantalum alloy, etc. can be used for the IDT electrode 3 on the one main surface of the piezoelectric substrate 2. A laminated film of layers composed of the materials and a laminated film of the materials and layers composed of materials such as titanium and chromium may be used. Usable as a method of depositing the conductor layer are a sputtering method and an electron beam evaporation method.

Examples of a method of patterning the IDT electrode 3 include a method of depositing the conductor layer, followed by photolithography, and then making RIE (Reactive Ion Etching) or wet etching. Alternatively, a lift-off process for forming a photoresist on one main surface of the piezoelectric substrate 2 before depositing the IDT electrode 3, followed by photolithography, to open a desired pattern, then depositing a laminated film, and then removing both the photoresist and the laminated film deposited in an unnecessary portion may be carried out.

The semiconductor layer 22 is then formed on the other main surface of the piezoelectric substrate 2. Usable as the semiconductor layer 22 are at least one of materials such as silicon, germanium, titanium oxide, zinc oxide, and aluminum nitride, or a material mainly composed of at least one of the materials. The materials may include an additive or impurities. Usable as a method of depositing the semiconductor layer 22 are a sputtering method and an electron beam evaporation method.

The protective film 30 (shown in FIG. 3) for protecting the IDT electrode 3 is then deposited. Usable as a material for the protective film 30 are silicon, silica, etc. Examples of a method of depositing the protective film 30 include a sputtering method, a CVD (Chemical Vapor Deposition) method, and an electron beam evaporation method. In order to obtain a good film quality and adhesive properties in the protective film depositing step, the piezoelectric substrate 2 is heated to deposit the protective film, or the surface of the piezoelectric substrate 2 is exposed to plasma so that the temperature thereof becomes approximately 50 to 300° C. even in a case where the piezoelectric substrate 2 is not positively heated. In such a case, however, the semiconductor layer 22 formed on the other main surface of the piezoelectric substrate 2 effectively serves to prevent pyroelectric destruction.

A new conductor layer is then laminated on the input electrode sections 5, 5i, and 5j, the output electrode sections 6, 6i, and 6j, the ground electrodes 8 and 11, and the annular conductor 7, to form an input pad, an output pad, a ground electrode pad, and an annular electrode pad. The new conductor layer is for electrically and/or structurally connecting the surface acoustic wave device 1 and the mounting substrate 31 to each other with high reliability. For example, the conductor layer has the function of ensuring the wettability of the solder and preventing diffusion in a case where a solder is used for the connection, while having the function of adjusting the hardness of the pad such that gold can be made to adhere thereto using ultrasonic waves or the like in a case where a gold bump is used for the connection. Usable as materials and structures of such a new conductor layer are a laminated film of chromium, nickel and gold or a laminated film of a chromium, silver, and gold, and a thick film of gold or aluminum. Examples of a depositing method include a sputtering method and an electron beam evaporation method. In order to also obtain a good film quality and adhesive properties in the new conductor layer depositing step, the piezoelectric substrate 2 is heated to deposit the conductor layer, or the surface of the piezoelectric substrate is exposed to plasma so that the temperature thereof becomes approximately 50 to 300° C. even in a case where the piezoelectric substrate 2 is not positively heated. In such a case, however, the semiconductor layer 22 formed on the other main surface of the piezoelectric substrate 2 effectively serves to prevent pyroelectric destruction.

In a case where the surface acoustic wave device is manufactured by a so-called multiple sampling method in which a large number of surface acoustic wave device regions are formed on one piezoelectric substrate, the piezoelectric substrate is then divided or separated for each of the surface acoustic wave device regions, to obtain a large number of surface acoustic wave devices 1. Examples of a dividing or separating method include a dicing method using a dicing blade and a laser cutting method by laser processing.

The surface acoustic wave device 1 is then mounted on the mounting substrate 31 with the one main surface of the piezoelectric substrate 2 opposed thereto, as shown in FIG. 3.

As shown in FIG. 3, the surface acoustic wave device 1 mounted on the mounting substrate 31 is resin-molded using sheathing resin 34, and the mounting substrate 31, together with the sheathing resin 34, is divided by dicing or the like for each surface acoustic wave device 1, to obtain a surface acoustic wave apparatus according to the present invention.

The sheathing resin 34 may contain a filler composed of aluminum nitride, silver, nickel, etc. The thermal conductivity of the sheathing resin 34 is increased by containing such a filler. Thus, the heat radiation characteristics of the surface acoustic wave device 1 are improved, thereby improving the power resistance of the IDT electrode 3.

According to the surface acoustic wave apparatus comprising the surface acoustic wave device 1 and the mounting substrate 31, the annular conductor 7, surrounding the filter region 9 or the transmission-side filter region 12 and the receiving-side filter region 13, is formed on the one main surface of the piezoelectric substrate 2 in the surface acoustic wave device 1. The pads in the surface acoustic wave device 1 are respectively connected to the terminals of the mounting substrate 31 through a conductor bump. The annular conductor 7 is connected to the substrate-side annular conductor 32 formed so as to correspond thereto on the upper surface of the mounting substrate 31 in such a manner that the inside thereof is sealed in an annular shape using a brazing material 33 such as a solder.

This configuration allows the airtightness on the side of an operation surface of the surface acoustic wave device 1 to be maintained, so that the surface acoustic wave device 1 can be stably operated without being affected by a sheathing protective material or the like, and the operation can be stably performed for a long time period, thereby making the surface acoustic wave apparatus highly reliable.

Degradation by oxidation or the like of the IDT electrodes, the pads, and the terminals can be effectively prevented by sealing nitrogen gas that is inert gas, for example, into the surface acoustic wave device 1 hermetically sealed in an annular shape by the annular conductor 7 and the substrate-side annular conductor 32, thereby making the surface acoustic wave apparatus more highly reliable.

As described in the foregoing, in the surface acoustic wave device 1 in the surface acoustic wave apparatus according to the present invention, the filter region 9 or the transmission-side filter region 12 and the receiving-side filter region 13 each comprising the IDT electrode 3 and the input electrode section 5 or sections 5i and 5j and the output electrode section 6 or sections 6i and 6j is/are formed on the one main surface of the piezoelectric substrate 2, and the semiconductor layer 22 is formed on the other main surface of the piezoelectric substrate 2.

Therefore, carries on the semiconductor layer 22 cannot easily follow a high-frequency electric field in the vicinity of the pass band of the filter formed in the surface acoustic wave device 1, as compared with those in a case where the conductor layer is formed on the other main surface of the piezoelectric substrate as in the conventional example. Thus, a parasitic capacitance formed between the input electrode section 5 and the output electrode section 6 in the filter region 9 and a parasitic capacitance formed between the input electrode section Si in the transmission-side filter region 12 and the output electrode section 6j in the receiving-side filter region 13 can be reduced. Consequently, degradation of out-of-band attenuation characteristics and isolation characteristics caused by the parasitic capacitance can be restrained, thereby allowing the isolation characteristics to be improved.

Furthermore, in this configuration, the semiconductor layer 22 is formed on the other main surface of the piezoelectric substrate 2 so that charges generated due to a rapid temperature change in the manufacturing process can be efficiently discharged, thereby making it possible to obtain the effect of preventing damage to the electrode such as pyroelectric destruction caused by the pyroelectric properties of the piezoelectric substrate 2.

Figure 2:
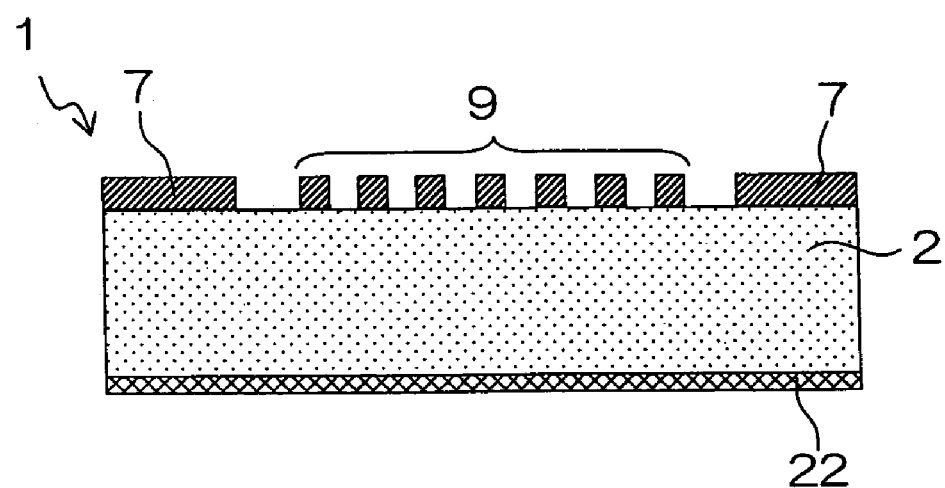
FIG. 2(a) is a schematic sectional view showing a surface acoustic wave device according to the present invention.
FIG. 2(b) is a plan view showing the other main surface of the surface acoustic wave device shown in FIG. 2(a)
Figure 2:
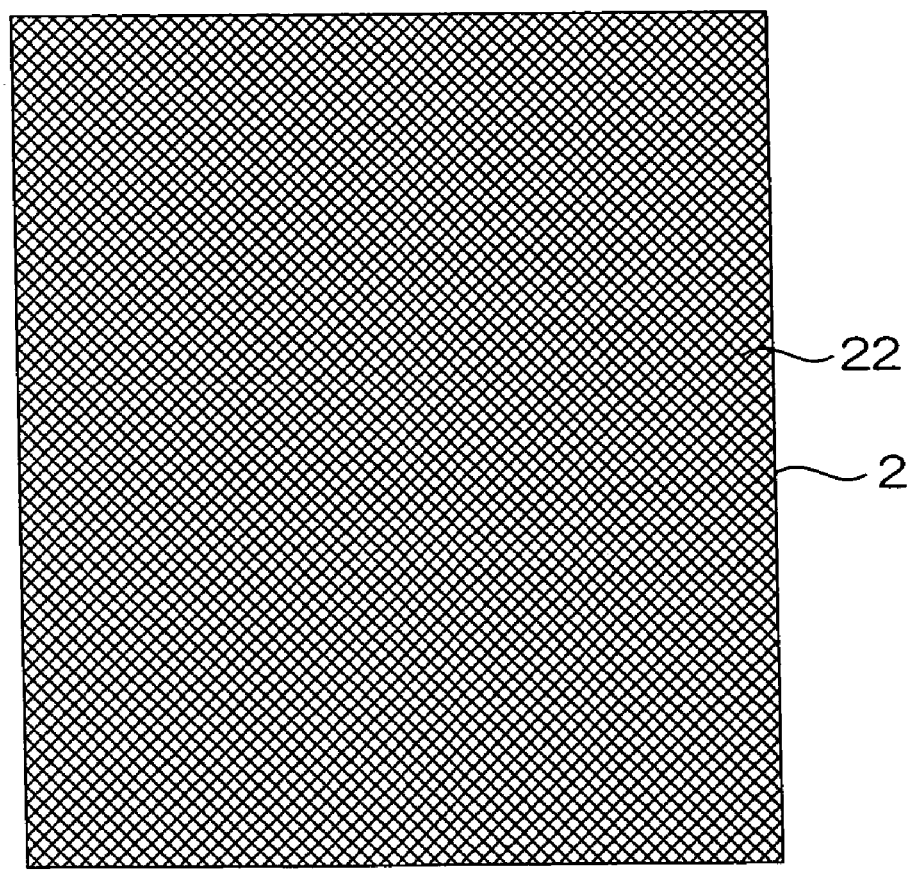

Although in the embodiment shown in FIG. 2, the semiconductor layer 22 is formed by being deposited on the other main surface of the piezoelectric substrate 2, the piezoelectric substrate 2 composed of a lithium tantalate single crystal, a lithium niobate single crystal, or a lithium tetraborate single crystal can be brought into a state where the oxygen content thereof is lower than a stoichiometric composition ratio by subjecting the other main surface of the piezoelectric substrate 2 to reduction treatment.

In such a state, a piezoelectric member has the property of having a conductivity in a direct current, while almost looking like an insulator in the vicinity of the pass band. Consequently, a layer having the same effect as the semiconductor layer 22 formed by the deposition can be formed by previously subjecting the other main surface of the piezoelectric substrate 2 to reduction treatment.

In this example, since the piezoelectric substrate 2 itself has a semiconductor layer, the step of forming the semiconductor layer 22 need not be added.

According to this configuration, charges can be prevented from being stored in the IDT electrode 3 without affecting the pass band characteristics of the filter. Even if there is no semiconductor layer 22 over the entire other main surface of the piezoelectric substrate 2, therefore, the pyroelectric destruction of the surface acoustic wave device 1 can be satisfactorily prevented. Moreover, the configuration is also advantageous in that the number of steps is not increased in the manufacturing process of the surface acoustic wave apparatus in order to prevent the pyroelectric destruction.

In the above-mentioned example, description was made of a case where the semiconductor layer 22 is formed over the entire other main surface of the piezoelectric substrate 2. In a case where carrier mobility in the semiconductor layer 22 cannot be sufficiently lowered, however, it is effective to pattern the semiconductor layer 22 and provide the semiconductor layer 22 in only a part of the other main surface of the piezoelectric substrate 2.

A region where the semiconductor layer 22 is not formed on the other main surface of the piezoelectric substrate 2 is referred to as a semiconductor unformed region (hereinafter referred to as an "unformed region").

Examples of methods of patterning the semiconductor layer 22 in order to provide the semiconductor layer 22 with an unformed region include a method of depositing the semiconductor layer 22, followed by photolithography, and then making RIE (Reactive Ion Etching), wet etching, sand blasting, etc.

Alternatively, a lift-off process for forming a photoresist on the other main surface of the piezoelectric substrate 2 before depositing the semiconductor layer 22, followed by photolithography, to open a desired pattern, then depositing the semiconductor layer 22, and then removing both the photoresist and the semiconductor layer 22 deposited in an unnecessary portion may be carried out.

Alternatively, the unformed region may be directly formed by removing the semiconductor layer 22 in a desired pattern using a router or the like without performing photolithography.

If a method of etching away the semiconductor layer 22 mainly by using a chemical action out of the foregoing methods is used, the semiconductor layer 22 on the other main surface can be partially removed reliably without greatly damaging the piezoelectric substrate 2.

When a method of grinding and removing the semiconductor layer 22 mainly by a physical action is used, while the semiconductor layer 22 is removed, the other main surface of the piezoelectric substrate 2 in its portion can be made coarser than that in the original state. Consequently, a bulk wave that had propagated in the piezoelectric substrate 2 from the filter region 9, 12, or 13, has been reflected on the other main surface of the piezoelectric substrate 2, and has been coupled to the IDT electrodes and others formed in the filter region 9, 12, or 13 to degrade the out-of-band attenuation characteristics or the isolation characteristics can be scattered in this portion on the other main surface of the piezoelectric substrate 2, thereby allowing the out-of-band attenuation characteristics or the isolation characteristics to be further improved.

As a pattern of the unformed region effective to improve the out-of-band attenuation characteristics or the isolation characteristics and prevent the pyroelectric destruction, the following patterns (1) to (10), for example, are exemplified.

Figure 7:
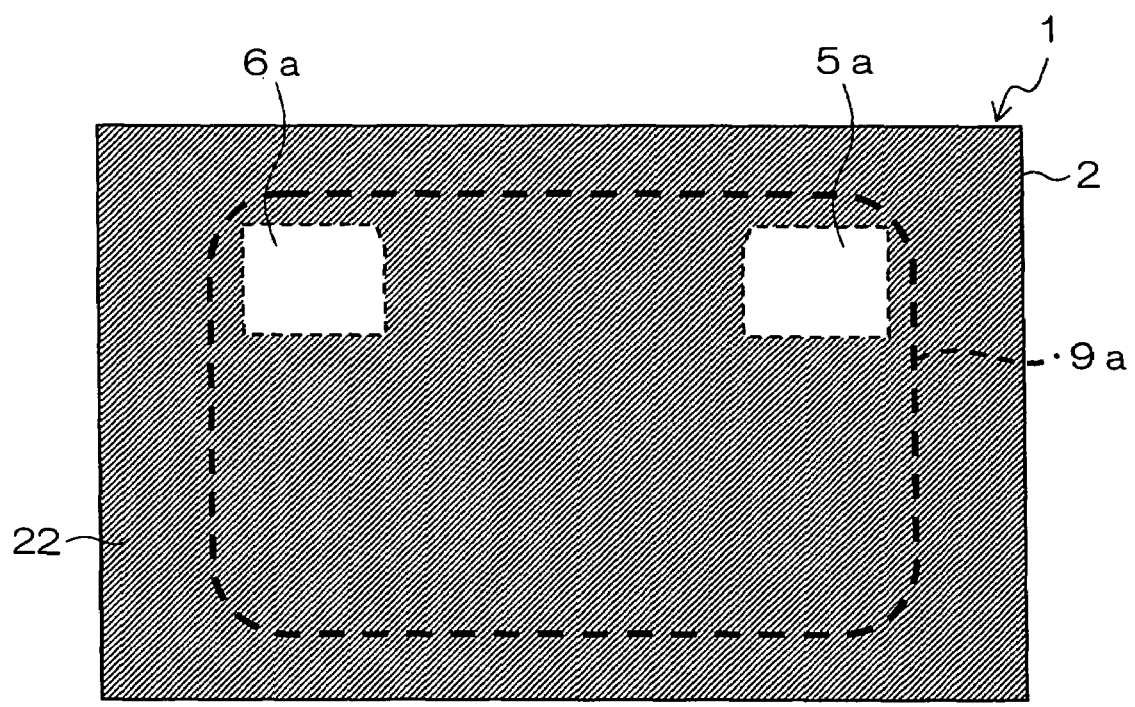
FIG. 7 is a plan view showing a formation pattern of a semiconductor layer on the other main surface of a piezoelectric substrate.

(1) As shown in FIG. 7, a pattern in which the semiconductor layer 22 is not formed by respectively taking regions 5a and 6a opposed to the input electrode section 5 and the output electrode section 6 as unformed regions on the other main surface of the piezoelectric substrate 2 may be used.

The semiconductor layer 22 is formed except for the region 5a opposed to the input electrode section 5 in the filter region 9 on the one main surface of the piezoelectric substrate 2 and the region 6a opposed to the output electrode section 6 in the filter region 9. The regions 5a and 6a are respectively unformed regions. In FIG. 7, reference numeral 9a denotes a region opposed to the filter region 9 shown in FIG. 1.

By thus forming the semiconductor layer 22 except for the regions 5a and 6a, the input electrode section 5 and the output electrode section 6 in the filter region 9 can be prevented from being capacitive-coupled to each other through a parasitic capacitance formed between the sections and the semiconductor layer 22. Consequently, out-of-band attenuation characteristics can be improved.

Although the pattern in which the semiconductor layer 22 exists in neither the region 5a opposed to the input electrode section 5 nor the region 6a opposed to the output electrode section 6 in the filter region 9 on the other main surface of the piezoelectric substrate 2 is illustrated in this example, the semiconductor layer 22 may not be provided in at least one of the regions 5a and 6a.

Figure 8:
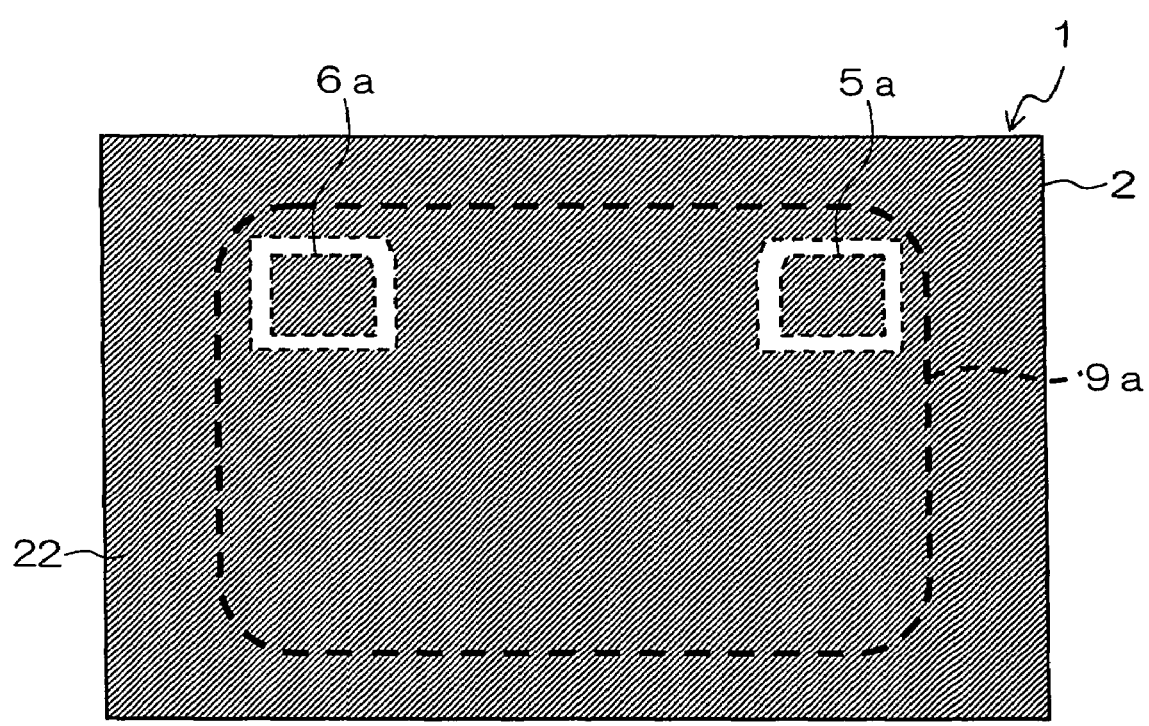
FIG. 8 is a plan view showing another formation pattern of a semiconductor layer on the other main surface of a piezoelectric substrate.

(2) FIG. 8 is a plan view of the other main surface of the surface acoustic wave device.

The semiconductor layer 22 in the piezoelectric substrate 2 is formed with a region 5a opposed to the input electrode section 5 in the filter region 9 in the piezoelectric substrate 2 and a region 6a opposed to the output electrode section 6 in the filter region 9 isolated from the other region. The isolated regions are electrically insulated from the other sections of the semiconductor layer 22.

This makes it possible to prevent the input electrode section 5 and the output electrode section 6 from being capacitive-coupled to each other through a parasitic capacitance formed between the sections and the semiconductor layer 22. Consequently, the out-of-band attenuation characteristics can be improved.

Although the pattern in which both the regions 5a and 6a are isolated from the other region in the semiconductor layer 22 is illustrated in this example, at least one of the regions 5a and 6a may be isolated from the other region in the semiconductor layer 22.

Figure 9:
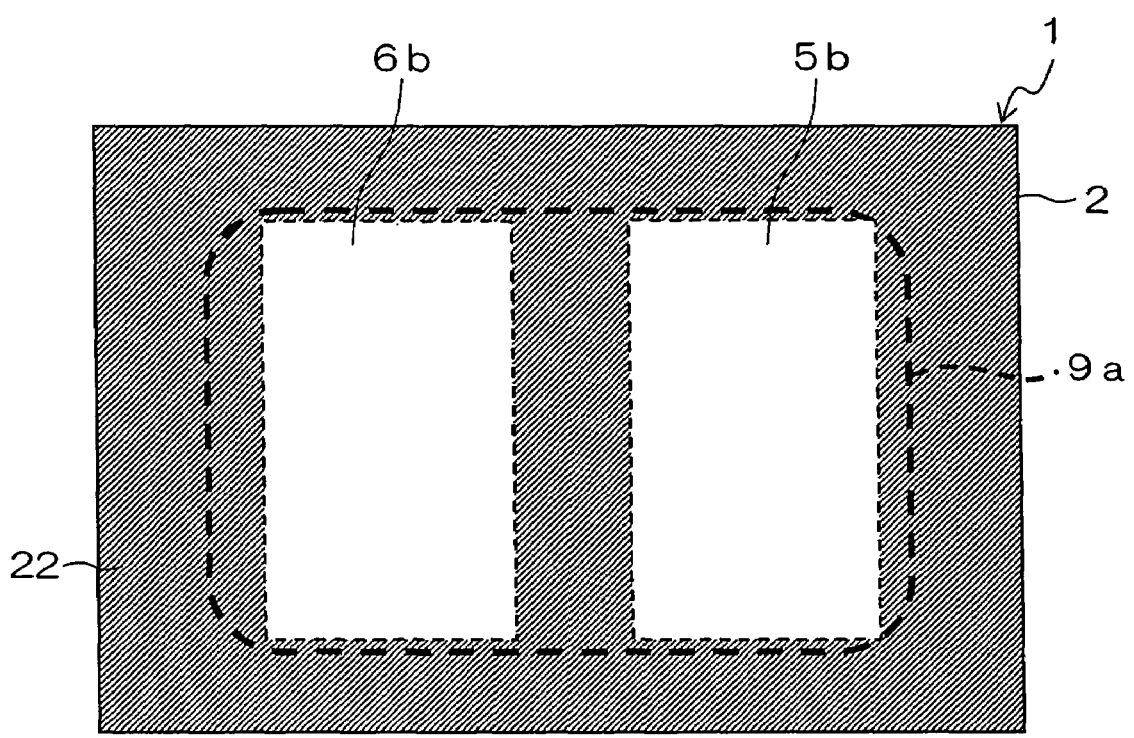
FIG. 9 is a plan view showing another formation pattern of a semiconductor layer on the other main surface of a piezoelectric substrate.

(3) As shown in FIG. 9, a simple pattern excluding a region 5b opposed to the whole portion including the input electrode section 5 in the filter region 9 on the one main surface of the piezoelectric substrate 2 and a region 6b opposed to the whole portion including the output electrode section 6 in the filter region 9 may be used.

Even if the unformed region is thus composed of a simple rectangular pattern, a higher effect of reducing capacitive coupling through a parasitic capacitance is obtained.

Figure 10:
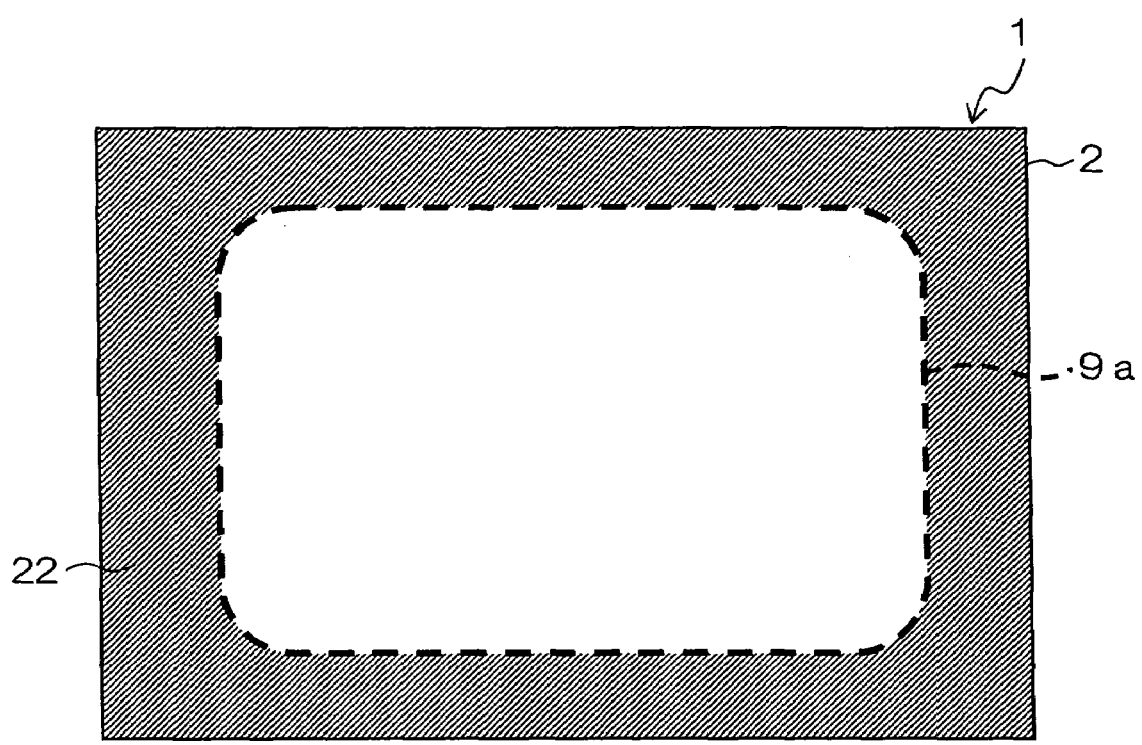
FIG. 10 is a plan view showing another formation pattern of a semiconductor layer on the other main surface of a piezoelectric substrate.

(4) As shown in FIG. 10, a pattern in which the semiconductor layer 22 is formed on the other main surface of the piezoelectric substrate 2 except for a region 9a opposed to the filter region 9 on the one main surface of the piezoelectric substrate 2 in order to further reliably restrain capacitive coupling through a parasitic capacitance may be used.

In a case where the region 9a opposed to the filter region 9 in the piezoelectric substrate 2 is excluded from the semiconductor layer 22, as in the example shown in FIG. 10, the surface roughness of the region 9a, from which the semiconductor layer 22 is excluded, on the other main surface of the piezoelectric substrate 2 may be higher than the surface roughness of a region where the semiconductor layer 22 is formed.

This allows the propagation of a bulk wave inside the piezoelectric substrate 2 to be reliably restrained in a wider area. Consequently, an amount of degradation by the propagation of the bulk wave out of degradation factors of the out-of-band attenuation characteristics can be effectively reduced. Therefore, it can be expected that the out-of-band attenuation characteristics are further improved.

The effect of improving the out-of-band attenuation characteristics corresponding to an amount of degradation by the propagation of the bulk wave by making the surface roughness of the region 9a from which the semiconductor layer 22 is excluded higher than the surface roughness of the region where the semiconductor layer 22 is formed is the same as in the examples shown in FIGS. 7 to 9.

Figure 11:
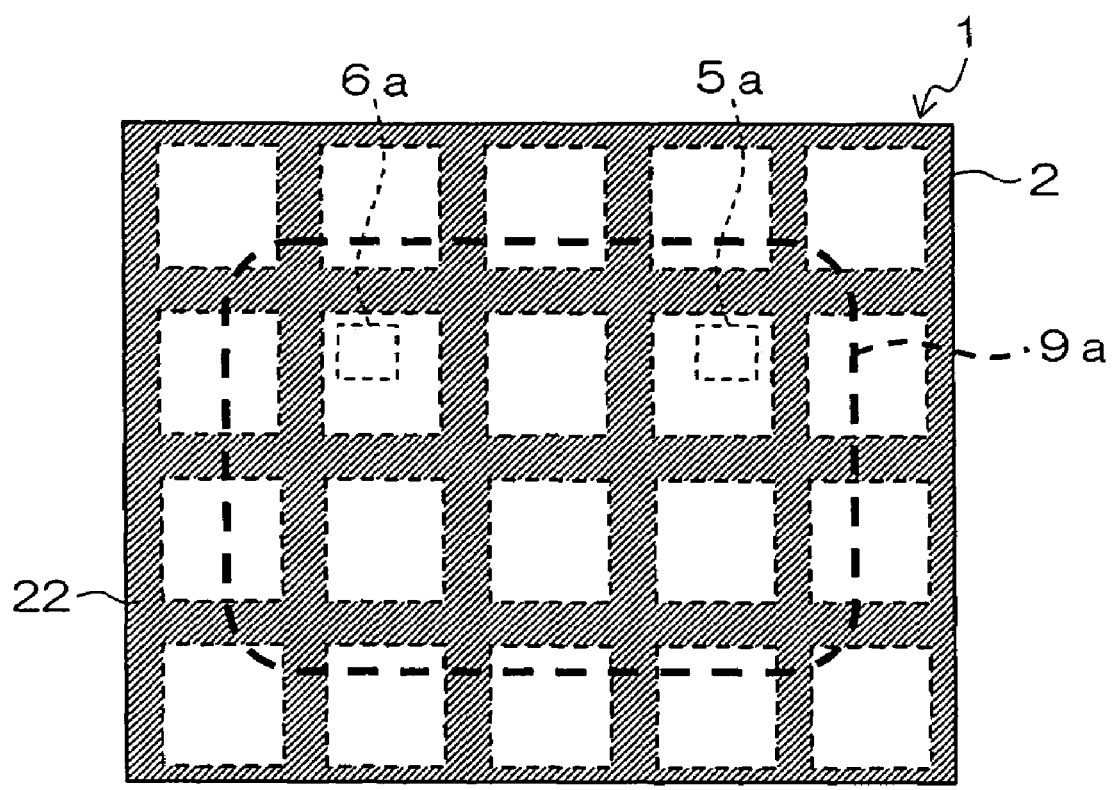
FIG. 11 is a plan view showing another formation pattern of a semiconductor layer on the other main surface of a piezoelectric substrate.

(5) As shown in FIG. 11, a pattern in which a plurality of unformed regions in the semiconductor layer 22 are dispersed to reduce the area in which a parasitic capacitance is possibly formed may be used. In this example, the semiconductor layer 22 is formed so as to have a lattice shape.

By forming the semiconductor layer 22 in such a shape, it is possible to make the area of the semiconductor layer 22 smaller as well as to make a parasitic capacitance formed between the input electrode section 5 and the output electrode section 6 in the filter region 9 lower, as compared with those in a case where the semiconductor layer 22 is formed over the entire other main surface of the piezoelectric substrate 2. Consequently, out-of-band attenuation characteristics can be improved.

Although a pattern in which a large number of unformed regions are dispersed on the other main surface of the piezoelectric substrate 2 including the region 5a opposed to the input electrode section 5 and the region 6a opposed to the output electrode section 6 in the filter region 9 in the piezoelectric substrate 2 is illustrated in this example, the effect of improving the out-of-band attenuation characteristics is obtained to some extent if the unformed regions are dispersed in a region including at least one of the regions 5a and 6a.

Since the pattern itself of the semiconductor layer 22 is formed continuously over the other main surface of the piezoelectric substrate 2, charges can be prevented from being stored in a region that is a part of the other main surface, thereby making it possible to reliably prevent the occurrence of pyroelectric destruction.

Although a simple lattice-shaped pattern in which unformed regions, each formed in a square shape, are arranged in a crosswise direction is illustrated as an example in FIG. 11, a pattern in which unformed regions, each formed in a circular shape, are arranged in a crosswise direction may be used, in which case the same effect is obtained. Further, a lattice-shaped pattern may be formed, inclined at an angle of 30 degrees or 45 degrees, for example.

(6) to (10), described below, are examples in which an unformed region where the semiconductor layer 22 is not formed is provided with respect to a duplexer-type surface acoustic wave device having two filter regions formed therein, as shown in FIGS. 4 and 6.

Figure 12:
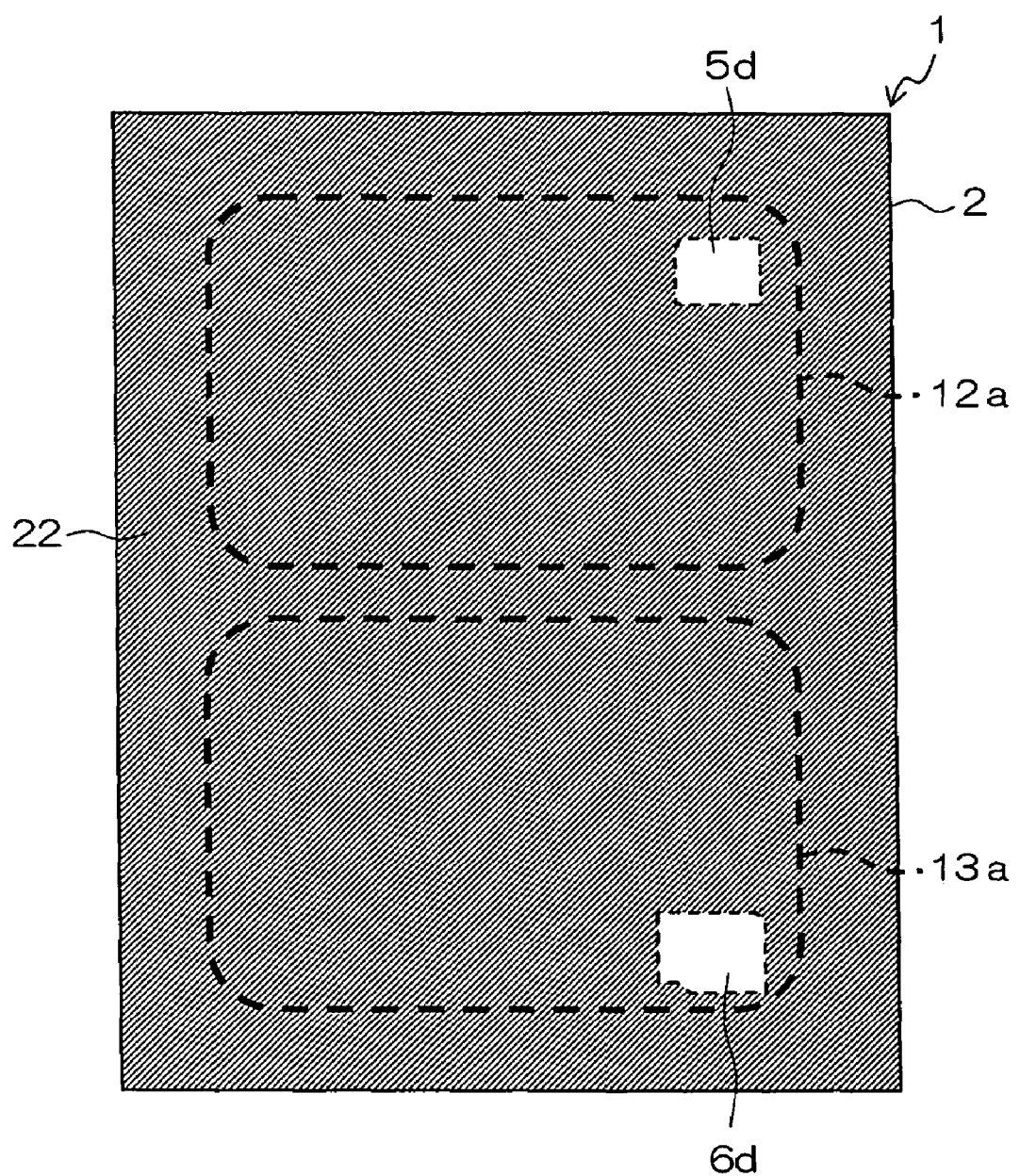
FIG. 12 is a plan view showing a formation pattern of a semiconductor layer on the other main surface of a surface acoustic wave device in which a transmission-side filter and a receiving-side filter are formed on a piezoelectric substrate.

(6) FIG. 12 is a plan view showing an example of an unformed region.

In this example, the semiconductor layer 22 is formed except for a region 5d opposed to the input electrode section 5i in the transmission-side filter region 12 and a region 6d opposed to the output electrode section 6j in the receiving-side filter region 13 on the one main surface of the piezoelectric substrate 2.

By thus forming the semiconductor layer 22 except for the regions 5d and 6d, the input electrode section 5i in the transmission-side filter and the output electrode section 6j in the receiving-side filter can be prevented from being capacitive-coupled to each other through a parasitic capacitance formed between the sections and the semiconductor layer 22. Consequently, isolation characteristics between the filters can be improved.

Although the pattern in which there is no semiconductor layer 22 in both the region 5d and the region 6d on the other main surface of the piezoelectric substrate 2 is illustrated in this example, the effect of improving the isolation characteristics to some extent is obtained if there is no semiconductor layer 22 in at least one of the regions 5d and 6d.

Figure 13:
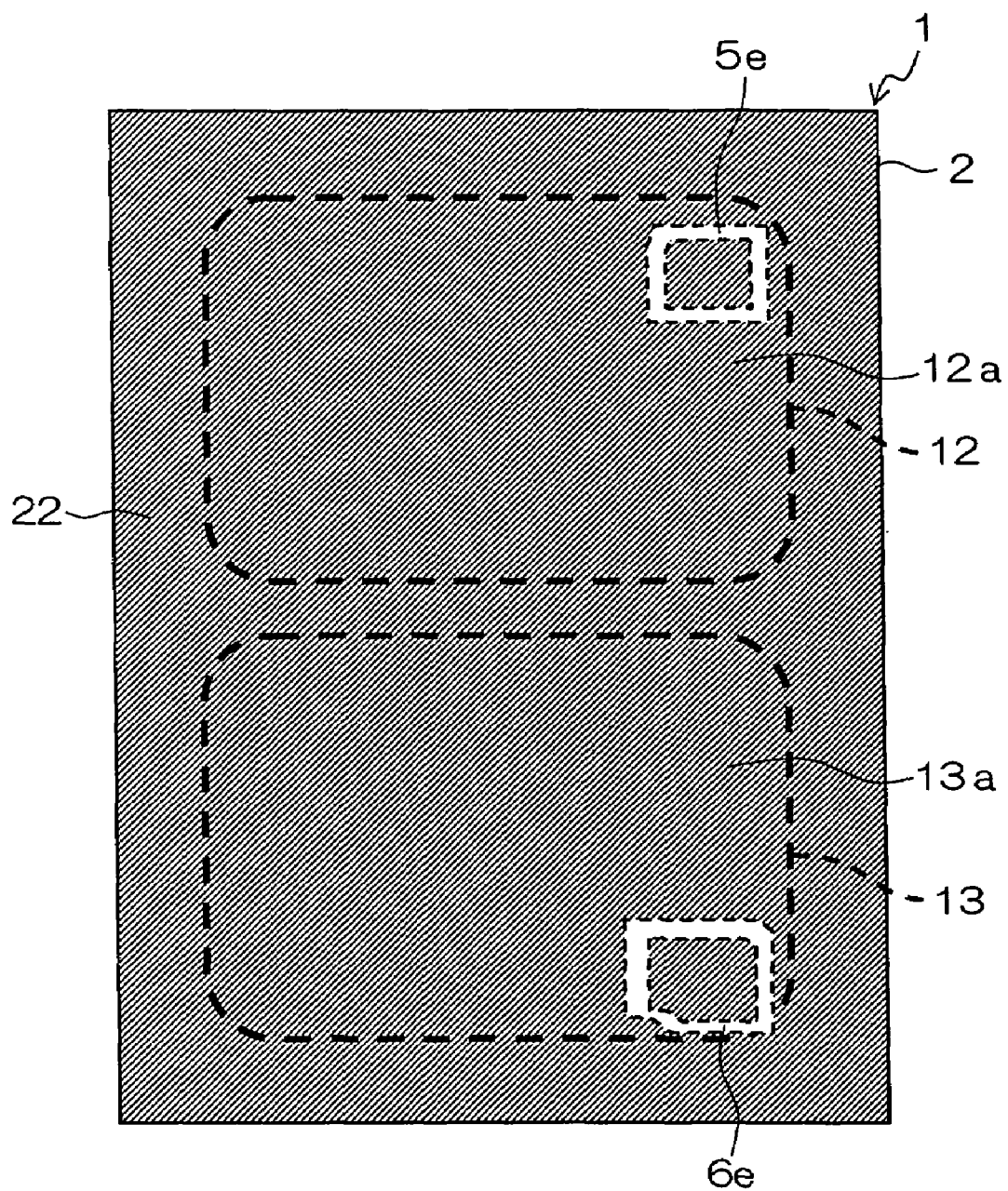
FIG. 13 is a plan view showing another formation pattern of a semiconductor layer on the other main surface of a surface acoustic wave device in which a transmission-side filter and a receiving-side filter are formed on a piezoelectric substrate.

(7) FIG. 13 is a plan view of a surface acoustic wave device, showing another example of an unformed region.

As shown in FIG. 13, the semiconductor layer 22 formed on the other main surface of the piezoelectric substrate 2 is formed with a region 5e opposed to the input electrode section 5i in the transmission-side filter region 12 and a region 6e opposed to the output electrode section 6j in the receiving-side filter region 13 in the piezoelectric substrate 2 each isolated from the other region.

By thus forming a pattern in which the region 5e and the region 6e are isolated from the other region, the input electrode section 5i in the transmission-side filter and the output electrode section 6j in the receiving-side filter can be prevented from being capacitive-coupled through a parasitic capacitance formed between the sections and the semiconductor layer 22. Consequently, isolation characteristics can be improved.

Although the pattern in which both the regions 5e and 6e are isolated from the other region in the semiconductor layer 22 is illustrated in this example, the effect of improving the isolation characteristics to some extent is obtained if at least one of the regions 5e and 6e is isolated from the other region in the semiconductor layer 22.

Figure 14:
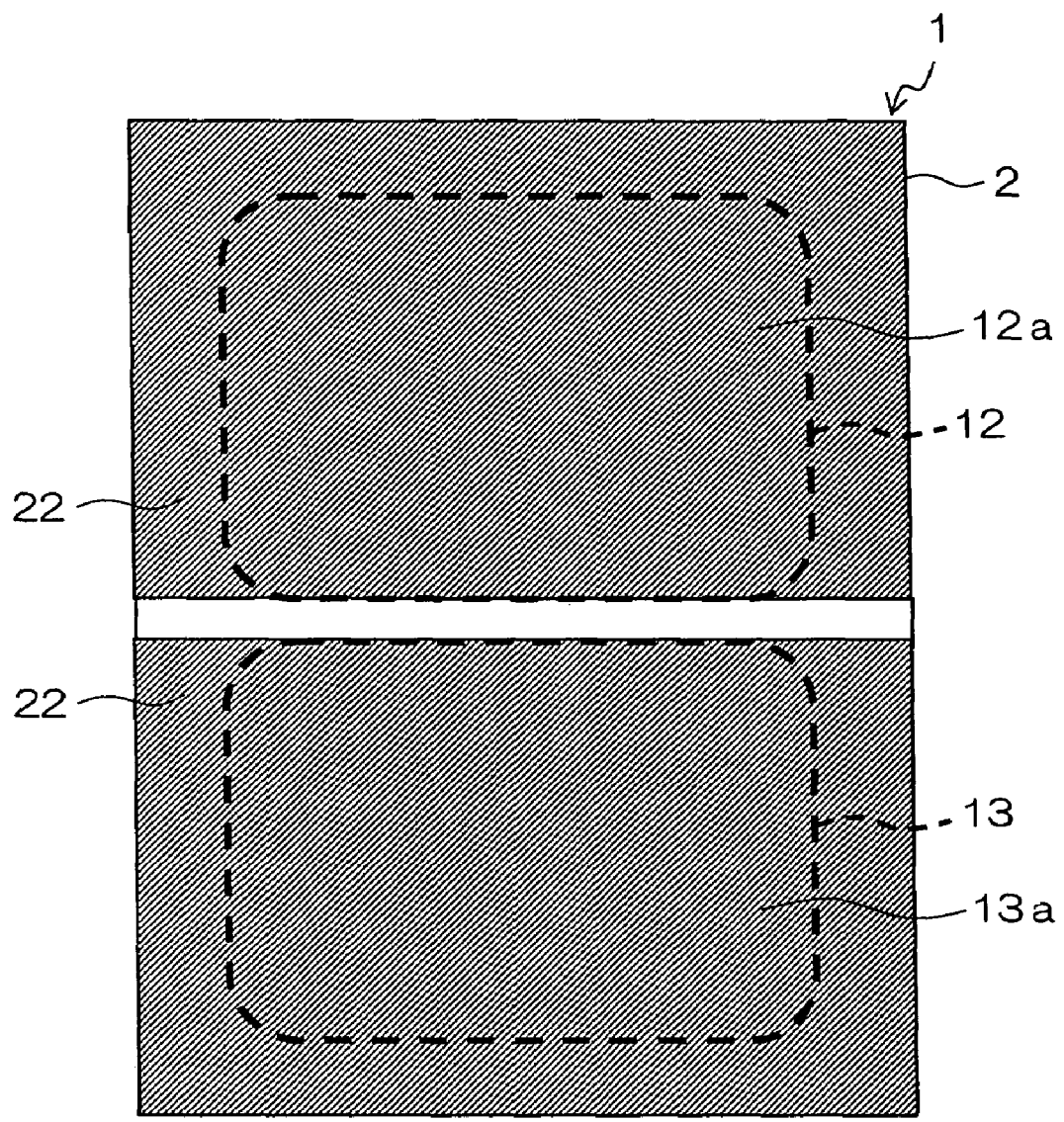
FIG. 14 is a plan view showing another formation pattern of a semiconductor layer on the other main surface of a surface acoustic wave device in which a transmission-side filter and a receiving-side filter are formed on a piezoelectric substrate.

(8) An example of still another pattern of the semiconductor layer 22 is illustrated in FIG. 14.

In this example, a region 12a opposed to the transmission-side filter region 12 and a region 13a opposed to the receiving-side filter region 13 on the one main surface of the piezoelectric substrate 2 are isolated from each other, to form the semiconductor layer 22 having two patterns on the other main surface of the piezoelectric substrate 2 in order to further reliably restrain capacitive coupling through a parasitic capacitance.

Thus, each of the patterns of the semiconductor layer 22 is formed in an electrically wide area. Since each of the patterns does not have an isolated region having an area extremely smaller than that in the periphery thereof, locally non-uniform storage of charges in the piezoelectric substrate 2, which is one cause of pyroelectric destruction, can be more effectively prevented.

Figure 15:
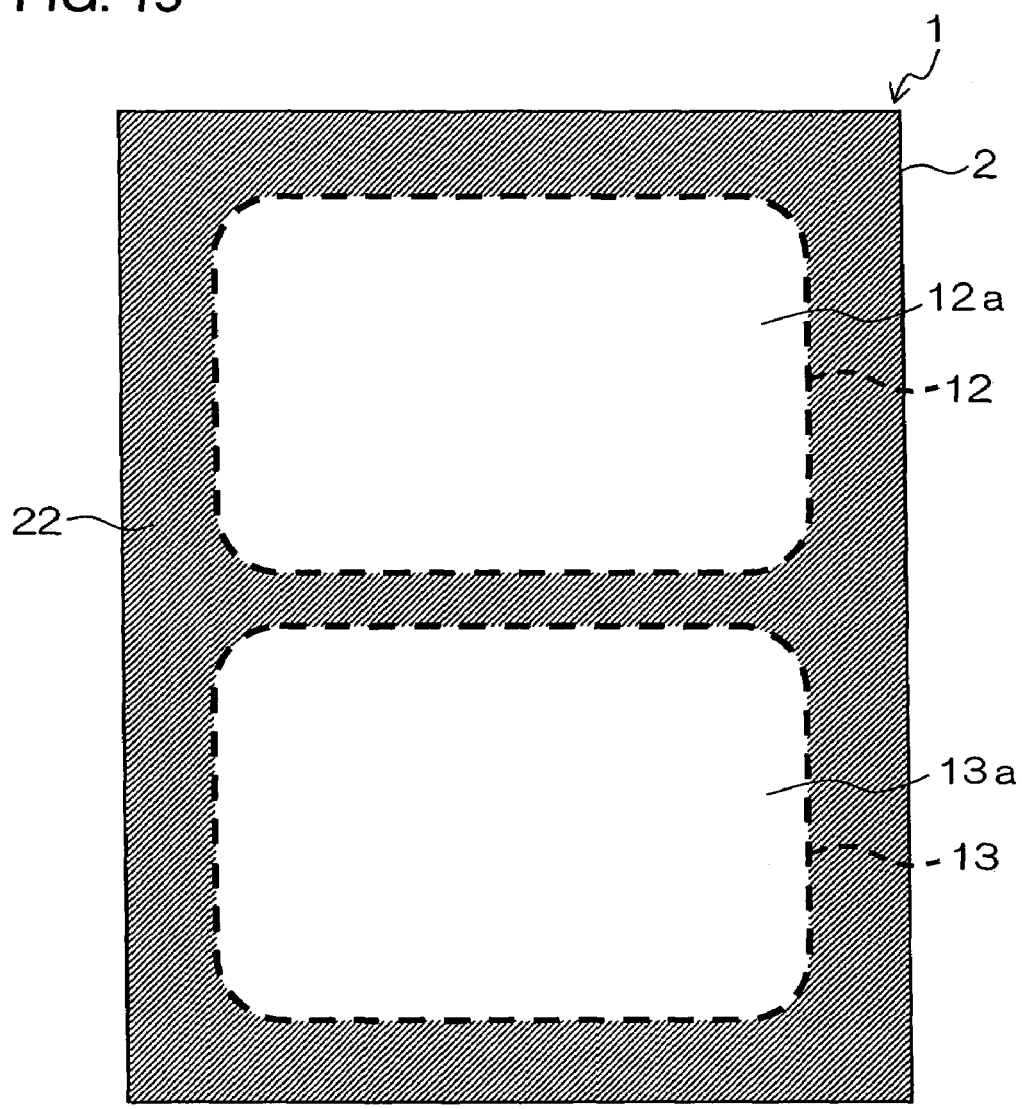
FIG. 15 is a plan view showing another formation pattern of a semiconductor layer on the other main surface of a surface acoustic wave device in which a transmission-side filter and a receiving-side filter are formed on a piezoelectric substrate.

(9) As shown in FIG. 15, a pattern of the semiconductor layer 22 may be formed except for both regions 12a and 13a opposed to the transmission-side filter region 12 and the receiving-side filter region 13 on the other main surface of the piezoelectric substrate 2.

The generation of an unnecessary parasitic capacitance between the transmission-side filter and the receiving-side filter and the semiconductor layer 22 can be reliably restrained by forming the semiconductor layer 22 on the other main surface of the piezoelectric substrate 2 except for the region 12a opposed to the transmission-side filter region 12 and the region 13a opposed to the receiving-side filter region 13 in the piezoelectric substrate 2, thereby making it possible to more reliably restrain degradation of isolation characteristics caused by capacitive coupling through the parasitic capacitance.

Consequently, a surface acoustic wave device being significantly superior in isolation characteristics and capable of effectively restraining the occurrence of pyroelectric destruction at the time of manufacturing is obtained.

When the surface roughness of the regions 12a and 13a, from which the semiconductor layer 22 is excluded, on the other main surface of the piezoelectric substrate 2 is made higher than the surface roughness of a region where the semiconductor layer 22 is formed in this case, the propagation of a bulk wave can be more reliably restrained. An amount of degradation by the propagation of the bulk wave out of degradation factors of the isolation characteristics can be effectively reduced, which is advantageous in further improving the isolation characteristics. The effect of improving the isolation characteristics by thus making the surface roughness of the regions 12a and 13a from which the semiconductor layer 22 is excluded higher than the surface roughness of the region where the semiconductor layer 22 is formed is the same in the examples shown in FIGS. 12 to 14.

Figure 16:
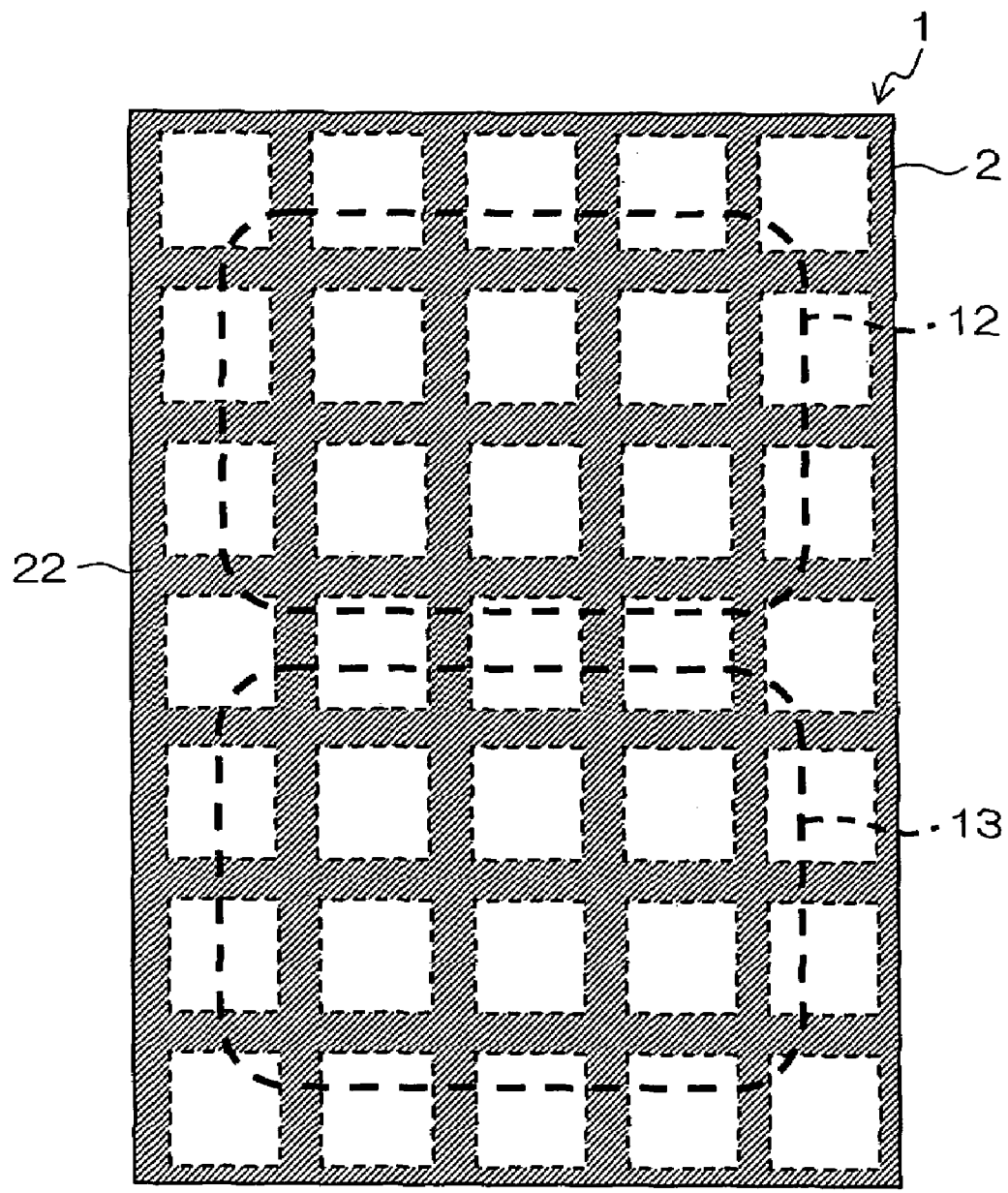
FIG. 16 is a plan view showing another formation pattern of a semiconductor layer on the other main surface of a surface acoustic wave device in which a transmission-side filter and a receiving-side filter are formed on a piezoelectric substrate.

(10) FIG. 16 is a plan view of the other main surface of a surface acoustic wave device having still another pattern.

The semiconductor layer 22 is formed on the other main surface of the piezoelectric substrate 2 by dispersing a large number of unformed regions. In this example, the unformed region is in a square shape, and the semiconductor layer 22 is formed so as to have a lattice shape.

The area of the semiconductor layer 22 can be reduced by forming the semiconductor layer 22 in such a shape. A parasitic capacitance formed between the semiconductor layer 22 and the input electrode sections 5i and 5j and the output electrode sections 6i and 6j can be reduced.

Since the pattern of the semiconductor layer 22 is formed continuously over a wide region on the other main surface of the piezoelectric substrate 2, charges can be prevented from being locally stored on the other main surface of the piezoelectric substrate 2, thereby making it possible to reliably prevent the occurrence of pyroelectric destruction.

Although a simple lattice-shaped pattern in which unformed regions, each formed in a square shape, are arranged in a crosswise direction is illustrated as an example of the semiconductor layer 22 in FIG. 16, a pattern in which unformed regions, each formed in a circular shape, are arranged in a crosswise direction may be used, in which case the same effect is obtained. Further, a lattice-shaped pattern may be formed, inclined at an angle of 45 degrees or 60 degrees, for example.

In the foregoing example, the formation area of the semiconductor layer 22 that may allow a parasitic capacitance to be formed is reduced to improve the out-of-band attenuation characteristics or the isolation characteristics. When a composite substrate composed of a piezoelectric material such as a lithium tantalate single crystal or a lithium niobate single crystal on its main surface and composed of another dielectric material having a lower dielectric constant than that of the piezoelectric material on the other main surface is used as the piezoelectric substrate 2, an effective dielectric constant between the semiconductor layer 22 and the electrode sections 5 and 6 formed on the one main surfaces of the piezoelectric substrate 2 can be made low, thereby allowing the parasitic capacitance to be reduced.

The piezoelectric substrate 2 composed of such two types of materials can be obtained by laminating a substrate composed of the piezoelectric material and a substrate composed of the dielectric material.

Usable as a material having a lower dielectric constant than that of the piezoelectric material composing the piezoelectric substrate 2 are (a) silicon (a dielectric constant of 3.4), silicon carbide, sapphire (a dielectric constant of 9.4), quartz (a dielectric constant of 3.8), crystal (a dielectric constant of 3.8), glass substrates (a dielectric constant of about 3.8), (b) ceramic substrates composed of alumina (a dielectric constant of about 8.5), etc., and (c) resin substrates composed of polyimides and liquid crystal polymers (some of them respectively have dielectric constants of not more than 10), etc.

In a case where the piezoelectric substrate 2 is a composite substrate in which a second substrate composed of a material having a lower coefficient of thermal expansion than that of the piezoelectric material such as silicon, glass, sapphire, quartz, crystal, or resin is joined to the first substrate composed of a piezoelectric material, it is possible to also improve the frequency temperature characteristics of the surface acoustic wave device 1 caused by distortion of the piezoelectric substrate 2 due to a temperature change, for example.

Furthermore, in a case where the piezoelectric substrate 2 is a composite substrate in which a second substrate composed of a material having a higher thermal conductivity than that of a first substrate composed of a piezoelectric material such as sapphire, quartz, crystal, or ceramics, heat generated in the filter regions 9, 12, and 13 is allowed to efficiently escape. Therefore, the rise in temperature of the piezoelectric substrate 2 itself can be restrained, thereby making it possible to improve the frequency temperature characteristics as well as to restrain degradation of the IDT electrode 3 that is accelerated by temperature.

Various types of piezoelectric materials used for the surface acoustic wave device may be used as the first substrate. When a lithium tantalate single crystal, a lithium niobate single crystal, or a lithium tetraborate single crystal, the oxygen content of which is smaller than a stoichiometric composition ratio, is used, however, both the effect of satisfactorily preventing pyroelectric destruction and the effect of reducing an effective dielectric constant can be obtained.

In communications equipment comprising at least one of a receiving circuit and a transmission circuit, the surface acoustic wave device according to the present invention can be used as a band-pass filter included in the circuit.

The present invention is applicable, for example, to communications equipment comprising a transmission circuit capable of attenuating an unnecessary signal using a band-pass filter with a transmission signal carried on a carrier frequency, then amplifying the transmission signal using a power amplifier, and transmitting the signal from an antenna through a duplexer.

Furthermore, the present invention is applicable to communications equipment comprising a receiving circuit for receiving a receiving signal using an antenna, amplifying the receiving signal using a low-noise amplifier through a duplexer, then attenuating an unnecessary signal using a band-pass filter, to separate the signal from a carrier frequency using a mixer, and extracting the signal.

If the surface acoustic wave device according to the present invention is employed for at least one of the receiving circuit and the transmitting circuit, there can be provided superior communications equipment having improved transmission characteristics according to the present invention.

Figure 17A:
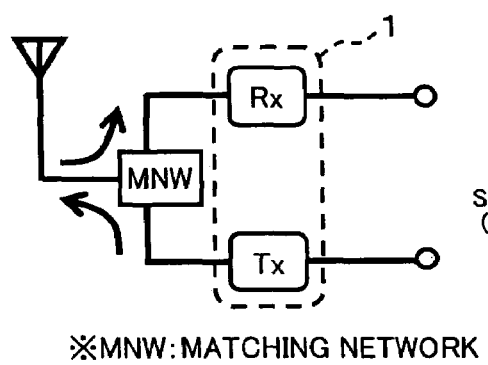
FIG. 17(a) is a circuit diagram of communications equipment in a case where there is no parasitic capacitance.
Figure 17B:
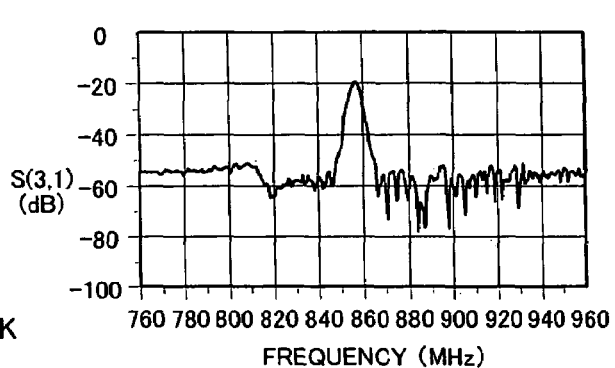
FIG. 17(b) is a graph showing an example of isolation characteristics in a case where there is no parasitic capacitance.
Figure 17C:
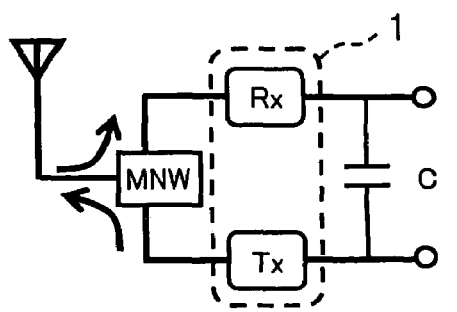
FIG. 17(c) is a circuit diagram of communications equipment in a case where there is a parasitic capacitance C.
Figure 17D:
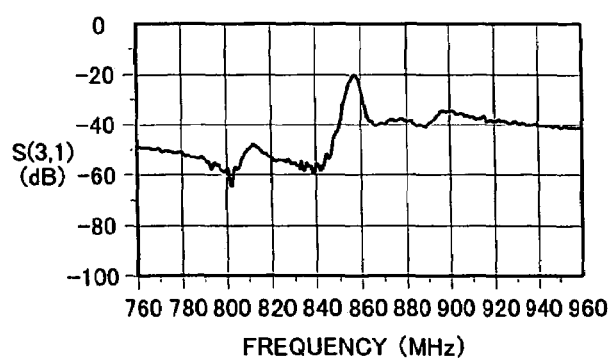
FIG. 17(d) is a graph showing an example of isolation characteristics in a case where there is a parasitic capacitance C.

A duplexer comprised of the surface acoustic wave apparatus according to the present invention can be applied to a front-end SAW-DPX in communications equipment, as in a circuit diagram of FIG. 17(a).

Figure 18:
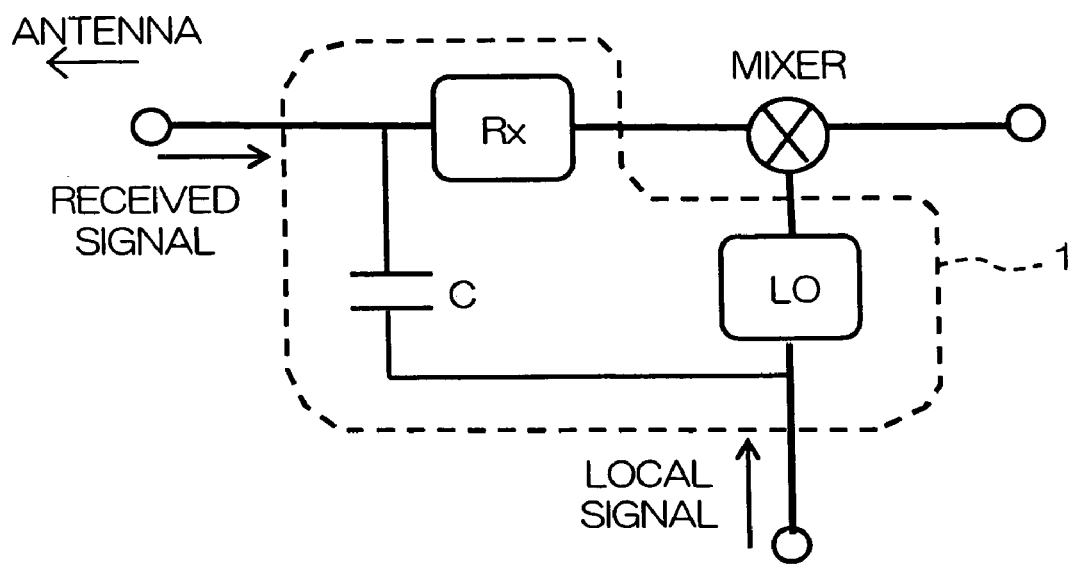
FIG. 18 is a circuit diagram showing an example in which a surface acoustic wave apparatus according to the present invention is applied to a branching filter in which an Rx filter between stages and an Lo filter having the property of passing a frequency band of a local signal are integrated with each other.

As in a circuit diagram of FIG. 18, the surface acoustic wave apparatus can be also applied to a branching filter that is an integration of a receiving-side filter for preventing a local signal to a mixer from leaking out toward an antenna in converting a received signal into an intermediate frequency as well as transmitting only the received signal and a filter having the property of passing a frequency band of the local signal.

FIG. 18 is a circuit diagram showing the configuration in the periphery of the mixer in the communications equipment. In FIG. 18, a parasitic capacitance C formed by a conductor layer on the other main surface of the piezoelectric substrate in the conventional surface acoustic wave apparatus is together illustrated.

The present invention is not limited to the foregoing examples. Various modifications can be made without departing from the scope of the present invention.

Although a case where a ladder-type filter is used is illustrated in FIGS. 1 and 4 to 6, the present invention does not limit the configuration of the filter. For example, a DMS (Dual Mode) type filter and an IIDT (Interdigitated IDT) type filter may be used.

The arrangement of input-output terminals is not limited to those shown in FIGS. 1 and 4 to 6. For example, input-output terminals may be positioned at diagonal corners of the piezoelectric substrate.

Furthermore, two or more sets of branching filters may be provided on the same piezoelectric substrate. Further, another filter that does not affect the isolation characteristics of the branching filters may be provided on the same piezoelectric substrate. In this case, the area occupied by the entire surface acoustic wave device can be made smaller in size, as compared with that in a case where a plurality of surface acoustic wave devices are separately produced.

Although the pattern in which the semiconductor layer 22 is left in the outer periphery of the piezoelectric substrate 2 is illustrated in FIGS. 7 to 16, the semiconductor layer 22 may not be particularly left in the outer periphery of the piezoelectric substrate 2.

Furthermore, although description was mainly made, with respect to a case where the unformed region is provided on the semiconductor layer in the foregoing examples, of an example in which the semiconductor layer is formed once on the other main surface of the piezoelectric substrate and the semiconductor layer in a desired region is then removed, a desired unformed region may be arranged in such a manner that a region having no semiconductor layer formed therein is previously set to form a semiconductor layer in a region other than the previously set region.

Although description was made by taking the low frequency-side filter as the transmission-side filter and taking the high-frequency-side filter as the receiving-side filter, the low frequency-side filter may be taken as a receiving-side filter and the high-frequency-side filter may be taken as a transmission-side filter.

Although description was made of an example in which the surface acoustic wave device according to the present invention is flip-chip mounted on the mounting substrate 31 in FIG. 3, for example, it may be flip-chip mounted on a package composed of ceramics or resin.

It is also effective to introduce the step of forming a semiconductor layer having an unformed region on the reverse surface of the piezoelectric substrate according to the present invention in directly flip-chip mounting a device manufactured using a so-called wafer-level-packaging (hereinafter referred to as WLP) technique for ensuring a vibration space on a surface of a piezoelectric substrate to form a sealed structure. In this case, PCB corresponds to the mounting substrate 31.

Figure 19:
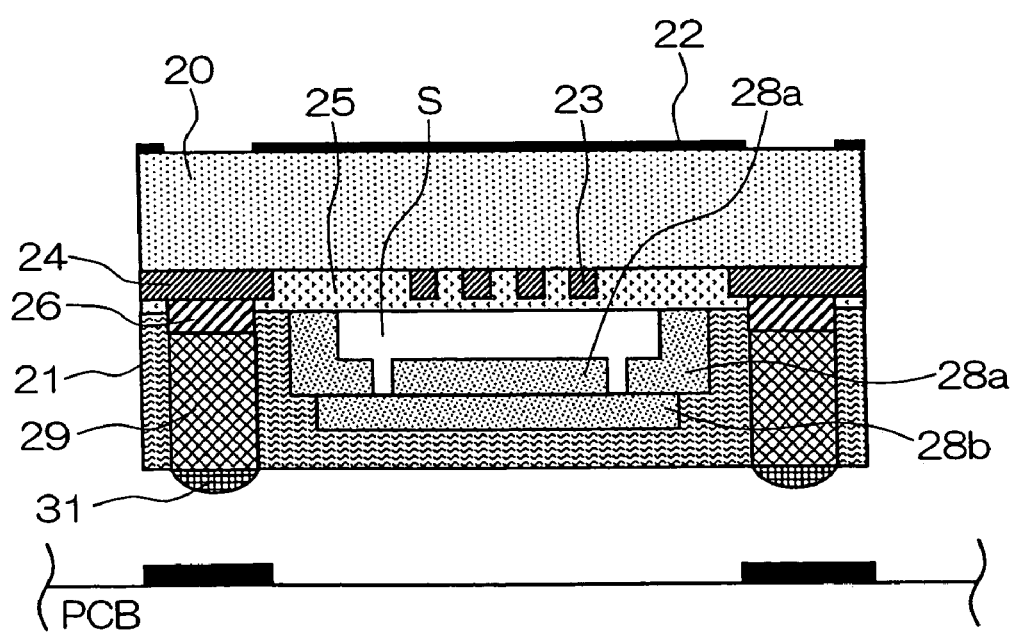
FIG. 19 is a cross-sectional view showing an example of a surface acoustic wave device manufactured using a WLP (Wafer-Level-Packaging) technique.

An example of the surface acoustic wave device manufactured using the WLP technique is illustrated in FIG. 19. IDT electrodes 23, input-output electrodes 24, and others are formed on a main surface of a piezoelectric substrate 20, and a vibration space S is ensured by cavity structures 28a and 28b. A pad electrode 26 is formed on the input-output electrode 24, and serves as a plating seed layer. Reference numeral 29 denotes a post electrode produced by plating. A terminal electrode 31, a protective film 25, sheathing resin 21, etc. may be formed as required. In the case of such a surface acoustic wave device, a very small surface acoustic wave apparatus can be realized.

EXAMPLE

First Example

On one main surface of a piezoelectric substrate 2 (whose substrate thickness is 250 μm) composed of a 38.7-degree Y-cut X-propagation lithium tantalate single crystal substrate, four conductor layers respectively composed of Ti, Al-1 mass % Cu, Ti, and Al-1 mass % Cu were deposited in this order on the side of the piezoelectric substrate 2 by a sputtering method. The thicknesses of the conductor layers were respectively 6 nm, 209 nm, 6 nm, and 209 nm.

The conductor layers were then patterned by photolithography and RIE, as shown in FIG. 1, to form a large number of surface acoustic wave device regions each having a filter region 9 comprising an IDT electrode 3, an input electrode section 5, and an output electrode section 6, as shown in FIG. 1. Used as etching gas at this time was mixed gas of $BCl_3$ and $Cl_2$.

Both the line width of electrode fingers of comb-shaped electrodes forming the IDT electrode 3 and the distance between the adjacent electrode fingers were approximately 1 μm.

A semiconductor layer 22 composed of silicon to which a small amount of boron had been added was then formed over the entire other main surface of the piezoelectric substrate 2 by a sputtering method. The thickness of the semiconductor layer 22 was 200 nm.

A new conductor layer composed of Cr, Ni, and Au was then laminated on the input electrode section 5, the output electrode section 6, the ground electrode 8, and the annular conductor 7, to form an input pad, an output pad, a ground electrode pad and an annular electrode pad. The thicknesses of the new conductor layers were respectively 6 nm, 1000 nm, and 100 nm.

The piezoelectric substrate 2 was then divided by dicing for each of the surface acoustic wave device regions, to obtain a large number of surface acoustic wave devices 1.

The surface acoustic wave device 1 was then mounted on a mounting substrate 31 composed of an LTCC (Low Temperature Co-fired Ceramics) substrate with its one main surface opposed thereto. Here, the LTCC substrate had a substrate-side annular conductor 32 corresponding to the annular conductor 7 formed on the one main surface of the piezoelectric substrate 2 and a pad electrode connected to the input-output pads and a ground pad in the surface acoustic wave device 1. A solder was previously printed on the substrate-side annular conductor 32 and the pad electrode.

In mounting the surface acoustic wave device 1, the surface acoustic wave device 1 was arranged so as to coincide with a solder pattern and was temporarily fixed by applying ultrasonic waves, and the solder was then melted by heating, to connect the annular conductor 7 and the substrate-side annular conductor 32 to each other and to connect the input-output pads and the pad electrode to each other.

Consequently, the filter region 9 in the surface acoustic wave device 1 was completely hermetically sealed by the substrate-side annular conductor 32 in the LTCC substrate and the annular conductor 7 connected thereto. The mounting process of the surface acoustic wave device 1 was carried out under a nitrogen atmosphere.

Resin molding was then carried out to protect the other main surface (reverse surface) of the surface acoustic wave device 1 using sheathing resin 34, and the mounting substrate 31 was finally diced among the surface acoustic wave devices 1, thereby obtaining a surface acoustic wave apparatus according to the present invention.

As a comparative example, a surface acoustic wave apparatus having a surface acoustic wave device, in which a filter region comprising IDT electrodes, an input electrode section, and an output electrode section, as shown in FIG. 1, was formed on one main surface of a piezoelectric substrate and a conductor layer was formed on the entire other main surface thereof, as in the conventional example, mounted on a mounting substrate 31 with its one main surface opposed thereto was produced.

Figure 20:
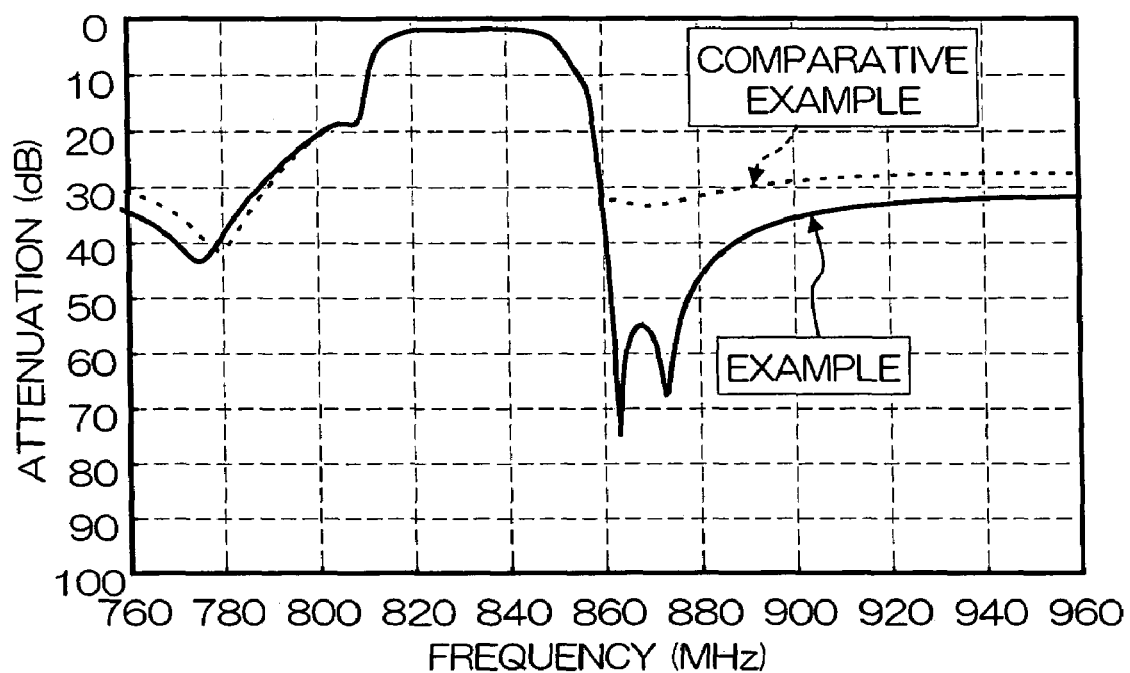
FIG. 20 is a graph showing the pass band characteristics of a surface acoustic wave apparatus manufactured in an example of the present invention.

The frequency characteristics were shown in a graph of FIG. 20 with respect to the example and the comparative example of the present invention thus produced.

In a graph of FIG. 20, a frequency(unit: MHz) is used to enter the horizontal axis, and an attenuation (unit: dB) is used to enter the vertical axis. A characteristic curve indicated by a dotted line shows results in the comparative example in which the conductor layer was formed on the entire other main surface of the piezoelectric substrate 2, and a characteristic curve indicated by a solid line shows results in the example in which the semiconductor layer was formed on the entire other main surface of the piezoelectric substrate 2.

As apparent from the results shown in FIG. 20, the surface acoustic wave apparatus in this example has a much better out-of-band attenuation, as compared with that in the comparative example. Particularly, the out-of-band attenuation in the vicinity of the pass band was more significantly improved, as compared with that in the comparative example.

When surface acoustic wave apparatuses, in which the semiconductor layer 22 in this example were patterned, as shown in FIGS. 7 to 11, were produced, and the frequency characteristics thereof were similarly evaluated, it was confirmed that an out-of-band attenuations in the vicinity of the pass band were also improved.

Second Example

This example is the same as FIG. 1 except that an annular conductor 7 was not provided in a surface acoustic wave device 1 and differs therefrom in a sealing structure.

In this example, the annular conductor 7 was replaced by a sealing structure comprising an annular insulator 41 and a cover member 42 for locally protecting an IDT electrode 3 to protect the IDT electrode 3, the periphery thereof was protected by sheathing resin 34, there was provided a through hole reaching an input electrode section 5, an output electrode section 6, and a ground electrode section (not shown) from an upper surface of the sheathing resin 34, and the through hole was filled with a conductor pillar 43, to form a connection electrode. Such a configuration allowed a smaller surface acoustic wave apparatus 40 than that in a case where the annular conductor 7 was used.

Here, the annular insulator 41 was formed using a photosensitive polyimide and a normal photolithographic process. Glass was used for the cover member 42, and the cover member 42 was caused to adhere to the annular insulator 41 using thermoplastic resin. The sheathing resin 34 was the photosensitive polyimide. After the sheathing resin 34 was formed with the through hole by the photolithographic process, the conductor pillar 43 was formed by plating, to form a terminal electrode (connection electrode).

As a comparative example, a surface acoustic wave apparatus having the same sealing structure as that in this example but using a surface acoustic wave device having no semiconductor layer 22 provided on its reverse surface was produced.

As a result of comparing yields with respect to the example and comparative example of the present invention thus produced, approximately 2% of the whole of the surface acoustic wave apparatus in the comparative example was defective by sparks caused by a pyroelectric effect during a sealing step. On the other hand, in the surface acoustic wave apparatus in this example of the present invention, no defects due to sparks were produced, and the yield was not decreased before and after the sealing step.

Figure 21:
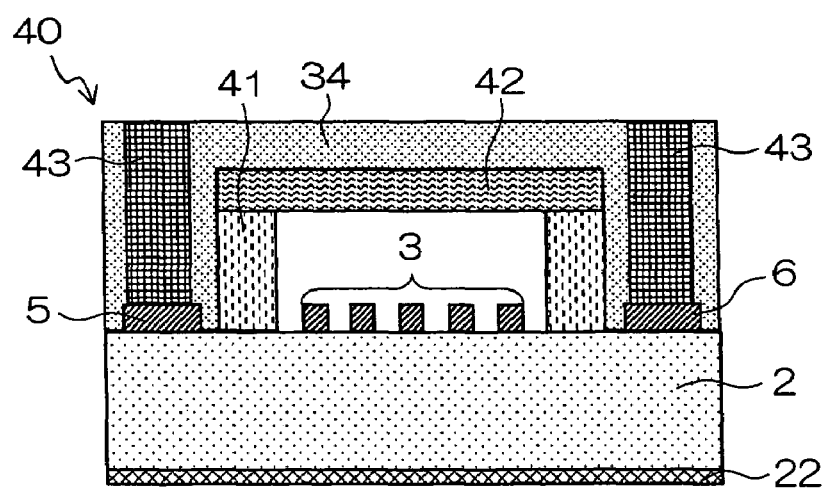
FIG. 21 is a cross-sectional view of an example of a surface acoustic wave device according to the present invention.
Figure 22:
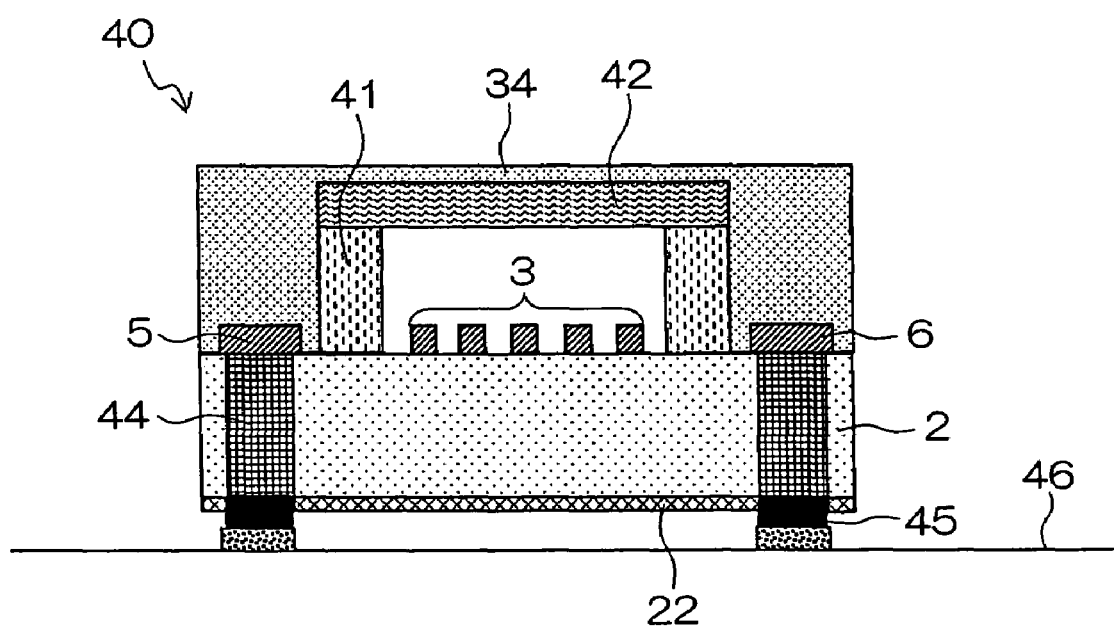
FIG. 22 is a cross-sectional view of another example of a surface acoustic wave device according to the present invention.

Although the conductor pillar 43 was provided on the one main surface of the surface acoustic wave device 1, to form a terminal electrode in FIG. 21, the terminal electrode may be formed by providing a piezoelectric substrate 2 with a through hole, providing a conductor layer on a wall surface of the through hole, and filling the through hole with a conductor 44, as shown in FIG. 22. In this case, mounting on a circuit board 46 is face-up mounting. However, since the size of the surface acoustic wave device itself is very small, the distance between the terminal electrodes is very small. The terminal electrodes are mounted on the circuit board 46 using a solder 45.

In a case where the ground electrode having an area in which the effect of preventing pyroelectric destruction is sufficiently obtained is formed on the reverse surface (the other main surface) of the surface acoustic wave device, the problem that the terminal electrode and the ground electrode are short-circuited arises. By forming the semiconductor layer 22 in place of the ground electrode as in the present invention, however, the terminal electrodes are not short-circuited, thereby making it possible to simultaneously solve the problems of pyroelectric destruction and short.

Third Example

On one main surface of a piezoelectric substrate 2 (whose substrate thickness is 250 μm) composed of a 38.7-degree Y-cut X-propagation lithium tantalate single crystal substrate, four conductor layers respectively composed of Ti, Al-1 mass % Cu, Ti, and Al-1 mass % Cu were deposited in this order on the side of the piezoelectric substrate 2 by a sputtering method. The thicknesses of the conductor layers were respectively 6 nm, 209 nm, 6 nm, and 209 nm.

The conductor layers were then patterned by photolithography and RIE, to form a large number of surface acoustic wave device regions each having a transmission-side filter region 12 and a receiving-side filter region 13 respectively comprising IDT electrodes 3, input electrode sections 5i and 5j, and output electrode sections 6i and 6j, as shown in FIG. 4. Used as etching gas at this time was a mixed gas of $BCl_3$ and $Cl_2$. Both the line width of comb-shaped electrodes forming the IDT electrode 3 and the distance between the adjacent comb-shaped electrodes were approximately 1 μm.

A semiconductor layer 22 composed of silicon to which a small amount of boron had been added was then formed on the other main surface of the piezoelectric substrate 2 by a sputtering method. The thickness of the semiconductor layer 22 was 200 nm.

A new conductor layer composed of Cr, Ni, and Au was then laminated on the input electrode sections 5i and 5j, the output electrode sections 6i and 6j, the ground electrode 11, and the annular conductor 7, to form an input pad, an output pad, a ground electrode pad and an annular electrode pad. The thicknesses of the new conductor layers were respectively 6 nm, 1000 nm, and 100 nm.

The piezoelectric substrate 2 was then divided by dicing for each of the surface acoustic wave device regions, to obtain a large number of surface acoustic wave devices 1.

The surface acoustic wave device 1 was then mounted on a mounting substrate 31 composed of an LTCC (Low Temperature Co-fired Ceramics) substrate with its one main surface opposed thereto. Here, the LTCC substrate had a substrate-side annular conductor 32 corresponding to the annular conductor 7 formed on the one main surface of the piezoelectric substrate 2 and a pad electrode connected to the input-output pads in the surface acoustic wave device 1. A solder was previously printed on the substrate-side annular conductor and the pad electrode. In mounting the surface acoustic wave device 1, the surface acoustic wave device 1 was arranged so as to coincide with the solder pattern and was temporarily fixed by applying ultrasonic waves, and the solder was then melted by heating, to connect the annular conductor 7 and the substrate-side annular conductor to each other and to connect the input-output pads and the pad electrode to each other. Consequently, the IDT electrodes 3 and the input-output pads in the surface acoustic wave device 1 were completely hermetically sealed by the substrate-side annular conductor in the LTCC substrate and the annular conductor 7 connected thereto. The mounting step of the surface acoustic wave device 1 was carried out under a nitrogen atmosphere.

Resin molding was then carried out to protect the other main surface (reverse surface) of the surface acoustic wave device 1 using sheathing resin 34, and the mounting substrate 31 was finally diced among the surface acoustic wave devices 1, thereby obtaining a surface acoustic wave apparatus according to the present invention.

Figure 23A:
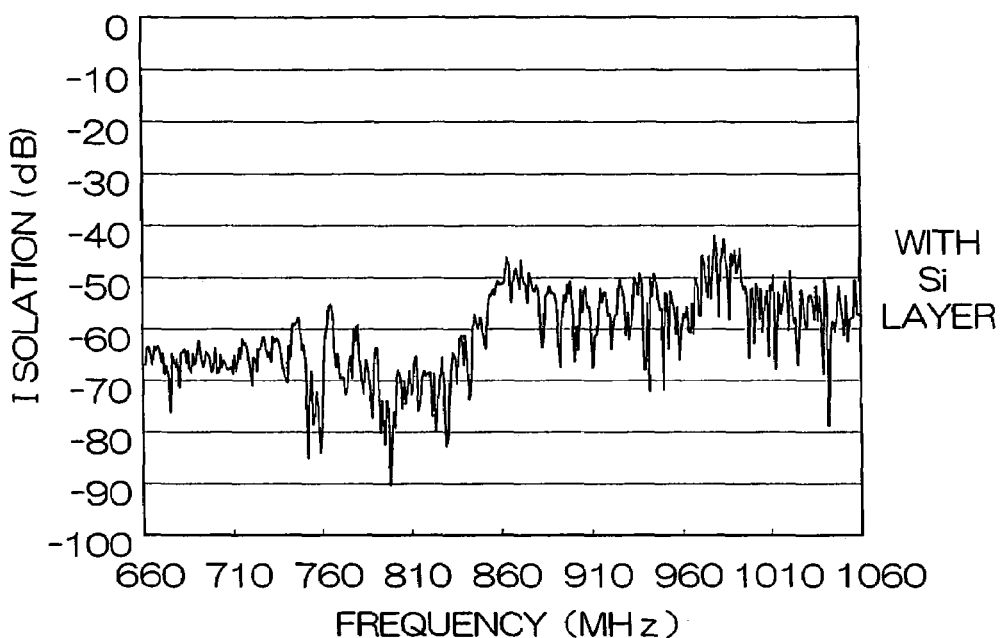
FIGS. 23(a) and 23(b) are graphs showing the isolation characteristics of a surface acoustic wave apparatus manufactured in an example of the present invention and a comparative example.
Figure 23B:
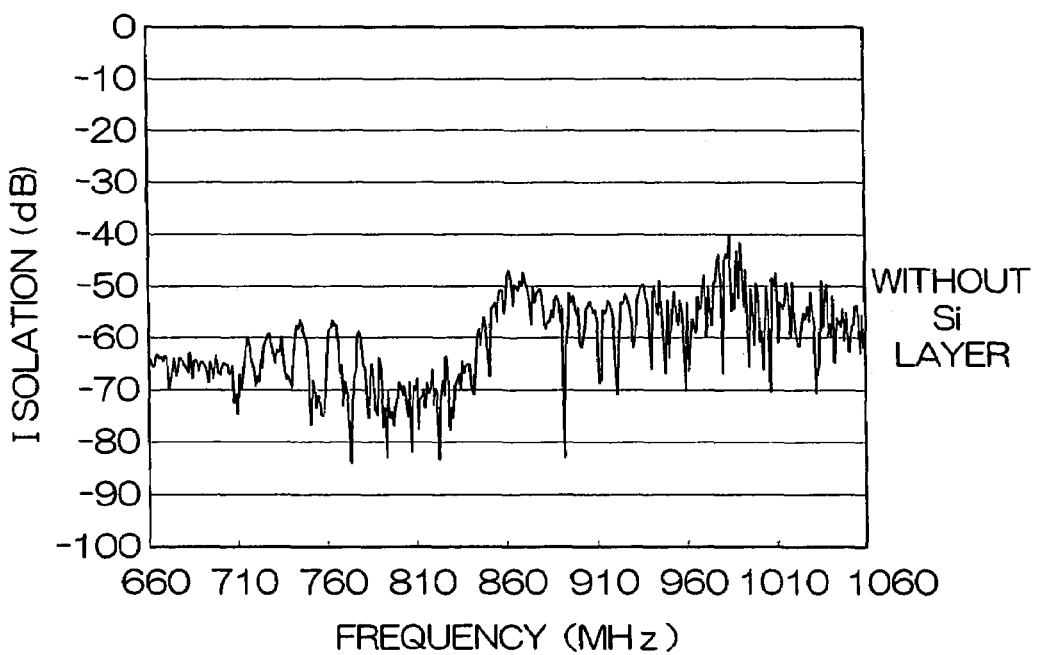

The isolation characteristics were shown in a graph of FIG. 23(*a*) with respect to the surface acoustic wave apparatus in the example thus produced.

As a comparative example, an Al layer serving as a conductor layer was deposited in place of the semiconductor layer 22 to produce a surface acoustic wave device, the Al layer was finally removed by wet etching, to produce a surface acoustic wave device having no layer that allows a parasitic capacitance to be formed provided on its other main surface. The Al film was deposited once and was later removed because in a case where the surface acoustic wave device did not have a configuration in which charges were discharged from the other main surface during the manufacturing process of the surface acoustic wave device, the IDT electrode was damaged by pyroelectric destruction, and the piezoelectric substrate was affixed to a substrate stage such as a deposition device by static electricity, so that the piezoelectric substrate itself was damaged when it was removed from the substrate stage by a projecting pin or the like in a case where it was automatically conveyed, for example. With respect to a surface acoustic wave apparatus produced by mounting the surface acoustic wave device in the comparative example on an LTCC substrate, as in the third example, the isolation characteristics thereof were shown in a graph of FIG. 23(*b*).

The isolation characteristics were found by applying an RF signal to an input terminal of a Tx filter and measuring a signal from an output terminal of an Rx filter (generally measured in a state where a matching network inserted between the Tx filter and the Rx filter is not incorporated when it was employed as a branching filter). In the graphs of FIG. 23, a frequency(unit: MHz) is used to enter the horizontal axis, and an isolation (unit: dB) is used to enter the vertical axis. A characteristic curve indicates the frequency characteristics of the isolation.

As can be seen from results shown in FIGS. 23(*a*) and 23(*b*), the surface acoustic wave apparatus on which the surface acoustic wave device 1 in this example was mounted had substantially the same waveform as the surface acoustic wave apparatus on which the surface acoustic wave device in the comparative example having no layer that allows a parasitic capacitance to be formed provided thereon was mounted, so that it had very good isolation characteristics.

The surface acoustic wave apparatus in the third example of the present invention thus produced was suitable as a branching filter that was small in size while having good isolation characteristics.

Fourth Example

One main surface of a piezoelectric substrate 2 (whose substrate thickness is 250 μm) composed of a 38.7-degree Y-cut X-propagation lithium tantalate single crystal substrate was then protected by photoresist, and the photoresist was then also applied to the other main surface thereof to form an opening corresponding to a region that would not be a surface acoustic wave device region in the subsequent steps, and the semiconductor layer 22 composed of silicon to which a small amount of boron was added was formed on the opening by a sputtering method. The film thickness thereof was 200 nm.

Thereafter, both the photoresist and the semiconductor layer deposited in an unnecessary portion were removed, and the semiconductor layer 22 was formed only in the region corresponding to the region that would not be a surface acoustic wave device region in the subsequent steps. A pattern of the semiconductor layer 22 on the other main surface of the piezoelectric substrate 2 was the same as that shown in FIG. 15.

On one main surface of the piezoelectric substrate 2, four conductor layers composed of Ti, Al-1 mass % Cu, Ti, and Al-1 mass % Cu were deposited in this order on the side of the piezoelectric substrate 2 by a sputtering method. The thicknesses of the conductor layers were respectively 6 nm, 209 nm, 6 nm, and 209 nm.

The conductor layers on the one main surface of the piezoelectric substrate 2 were then patterned by photolithography and RIE, to form a large number of surface acoustic wave device regions each having a transmission-side filter region 12 and a receiving-side filter region 13 respectively comprising IDT electrodes 3, input electrode sections 5$i$ and 5$j$, and output electrode sections 6$i$ and 6$j$. Used as etching gas in the RIE was $BCl_3$ and $Cl_2$. Both the line width of comb-shaped electrodes forming the IDT electrode 3 and the distance between the adjacent comb-shaped electrodes were approximately 1 μm.

A protective film 30 composed of silica was then deposited on the one main surface of the piezoelectric substrate 2 by a plasma CVD method. The deposition temperature was 300° C., and the film thickness thereof was 20 nm.

A portion of the protective film 30 was then removed by photolithography and RIE, a resistor 15 composed of silicon to which a small amount of boron had been added was deposited in the portion by a sputtering method, and the IDT electrode 3 was connected to the annular conductor 7 through the resistor 15.

A portion of the protective film 30 was then removed by photolithography and RIE, a new conductor layer composed of Cr, Ni, and Au was then laminated on the input electrode sections 5$i$ and 5$j$, the output electrode sections 6$i$ and 6$j$, the ground electrode 11, and the annular conductor 7, to form an input pad, an output pad, a ground electrode pad and an annular electrode pad. The thicknesses of the new conductor layers were respectively 6 nm, 1000 nm, and 100 nm.

The piezoelectric substrate 2 was then divided by dicing for each of the surface acoustic wave device regions, to obtain a large number of surface acoustic wave devices 1. The subsequent mounting step was the same as in the foregoing examples.

Although destruction by sparks may occur during the mounting step in the third example, no destruction by sparks occurred by connecting the IDT electrode 3 to a ground potential in a DC manner by the resistor 15 in the fourth example.

The surface acoustic wave apparatus in the fourth example of the present invention thus produced was suitable as a branching filter that is small in size while having good isolation characteristics.

Fifth Example

Figure 24:
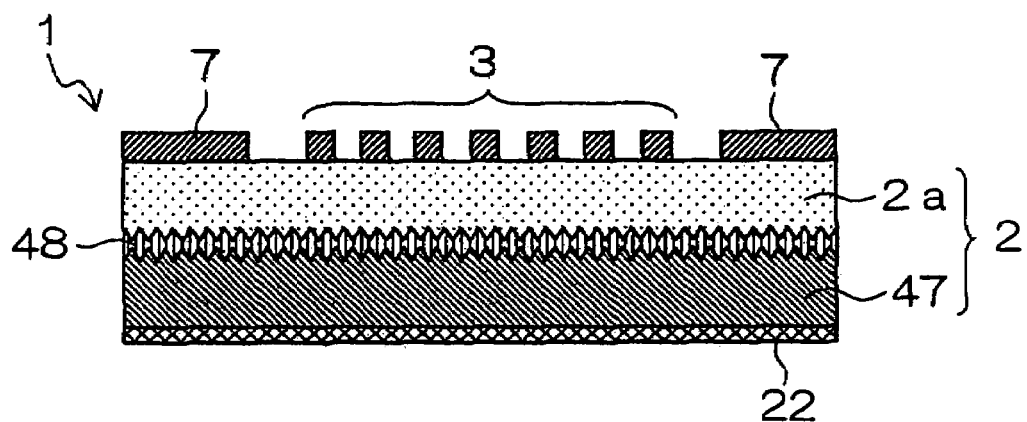
FIG. 24 is a cross-sectional view of an example of a surface acoustic wave device according to the present invention.
Figure 25:
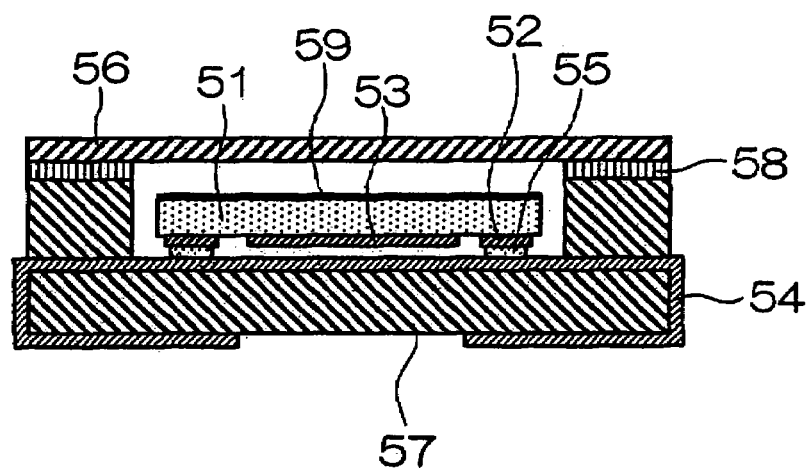
FIG. 25 is a cross-sectional view showing a mounting structure of a conventional surface acoustic wave apparatus.

FIG. 24 is a cross-sectional view of a surface acoustic wave device 1 in a surface acoustic wave apparatus in this example.

In this example, a composite substrate obtained by joining a lithium tantalate single crystal substrate 2$a$ and a crystal substrate 47 was used for a piezoelectric substrate 2.

Here, one main surface of the crystal substrate 47 was brought into a coarse surface and the other main surface thereof was brought into a mirror surface to previously form a ZnO layer 22 over the entire other main surface by a sputtering method. The thickness of the ZnO layer 22 was 200 nm.

On the other hand, one main surface of the lithium tantalate single crystal substrate 2$a$ was brought into a mirror surface (a surface forming an IDT electrode 3 and an annular conductor 7 in the subsequent steps), and the other main surface thereof was brought into a coarse surface, to join the other main surface of the lithium tantalate single crystal substrate 2$a$ and the one main surface of the crystal substrate 47 to each other using an adhesive layer 48. The other steps were the same as in the first and second examples.

By thus joining the coarse surfaces to each other, a bulk wave that had propagated inside the piezoelectric substrate 2 from one filter region 12 (13), was reflected on a junction interface, and was coupled to the IDT electrode 3 formed in the other filter region 13 (12), to degrade isolation characteristics can be reliably scattered. Further, the coarse surface had a large surface area and therefore, could be reliably joined to each other by the adhesive layer 48, thereby allowing the surface acoustic wave device 1 having a high reliability to be produced. The ZnO layer 22 had high carrier mobility because a film whose crystallinity is good was obtained. However, the effective dielectric constant of the composite substrate became lower than that in a case where the lithium tantalate single crystal substrate was used by itself, so that the isolation characteristics could be improved more greatly than that in the conventional example.

Although the present invention has been described and illustrated in detail, it is clearly understood that the same is by way of illustration and example only and is not to be taken by way of limitation, the spirit and scope of the present invention being limited only by the terms of the appended claims.

The disclosure of Japanese patent application Serial Nos. 2004-247510, filed on Aug. 26, 2004, and 2004-311245, filed on Oct. 26, 2004 are incorporated herein by reference.

What is claimed is:

1. A surface acoustic wave device comprising:
    a piezoelectric substrate,
    an IDT electrode, an input electrode section connected with the IDT electrode and an output electrode section connected with the IDT electrode each formed in a filter region on one main surface of the piezoelectric substrate, wherein
    the piezoelectric substrate has a semiconductor layer formed by depositing semiconductor on the other main surface opposite to the one main surface thereof, wherein the semiconductor layer is formed except for a region opposed to the input electrode section and/or to the output electrode section on the other main surface.
2. The surface acoustic wave device according to claim 1, wherein
    the semiconductor layer is composed of at least one of material selected from silicon, germanium, titanium oxide, zinc oxide, and aluminum nitride, or a material mainly composed of the one of these materials.

3. The surface acoustic wave device according to claim 1, wherein
the piezoelectric substrate is a composite substrate composed of a piezoelectric material providing the one main surface and another material providing the other main surface having a lower dielectric constant than that of the piezoelectric material.

4. The surface acoustic wave device according to claim 1, wherein
the surface roughness of a region where the semiconductor layer is not formed on the other main surface of the piezoelectric substrate is higher than the surface roughness of a region where the semiconductor layer is formed.

5. The surface acoustic wave device according to claim 1, wherein the filter region on one main surface of the piezoelectric substrate comprises
a transmission-side filter region and a receiving-side filter region.

6. A surface acoustic wave apparatus, comprising:
the surface acoustic wave device according to claim 1, and a mounting substrate,
wherein the piezoelectric substrate having the filter region formed therein is mounted on the mounting substrate with the one main surface thereof opposed to the mounting substrate.

7. The surface acoustic wave device according to claim 6, wherein
an annular conductor is formed so as to surround the filter region on the one main surface of the piezoelectric substrate, and
the annular conductor is joined to a substrate-side annular conductor formed so as to correspond thereto on the mounting substrate and
the annular conductor is at a ground potential.

8. The surface acoustic wave device according to claim 7, wherein
the IDT electrode is electrically connected to the annular conductor through a resistor.

9. Communications equipment comprising the surface acoustic wave device according to claim 1 as a circuit component of the receiving circuit.

10. Communications equipment comprising
the surface acoustic wave device according to claim 1 as a circuit component of the transmission circuit.

11. Communications equipment, wherein
the surface acoustic wave device according to claim 1 is used as a branching filter.

12. The surface acoustic wave device according to claim 1, wherein the semiconductor is deposited by a sputtering method or an evaporation method.

13. A manufacturing method of surface acoustic wave device comprising:
providing a piezoelectric substrate,
forming an IDT electrode, an input electrode section connected with the IDT electrode and an output electrode section connected with the IDT electrode each in a filter region on one main surface of the piezoelectric substrate,
depositing a semiconductor layer except for a region opposed to the input electrode section and/or to the output electrode section on the other main surface opposite to the one main surface of the piezoelectric substrate.

14. The manufacturing method of surface acoustic wave device according to claim 13, further comprising
laminating a semiconductor layer on the other main surface opposite to the one main surface of the piezoelectric substrate.

15. The manufacturing method of surface acoustic wave device according to claim 13, wherein the depositing process includes depositing by a sputtering method or an evaporation method.

16. The manufacturing method of surface acoustic wave device according to claim 13, wherein the semiconductor layer is composed of at least one of material selected from silicon, germanium, titanium oxide, zinc oxide, and aluminum nitride, or a material mainly composed of one of the material.

17. A manufacturing method of surface acoustic wave device comprising:
providing a piezoelectric substrate,
depositing a semiconductor layer on the other main surface opposite to one main surface of the piezoelectric substrate, and
then forming an IDT electrode, an input electrode section connected with the IDT electrode and an output electrode section connected with the IDT electrode each in a filter region on the one main surface of the piezoelectric substrate, wherein the semiconductor layer is formed except for a region opposed to the input electrode section and/or to the output electrode section on the other main surface.

18. The manufacturing method of surface acoustic wave device according to claim 17, wherein the depositing process includes depositing by a sputtering method or an evaporation method.

19. The manufacturing method of surface acoustic wave device according to claim 17, wherein the semiconductor layer is composed of at least one of material selected from silicon, germanium, titanium oxide, zinc oxide, and aluminum nitride, or a material mainly composed of one of these materials.

20. A surface acoustic wave device comprising:
a piezoelectric substrate,
an IDT electrode, an input electrode section connected with the IDT electrode and an output electrode section connected with the IDT electrode each formed in a filter region on one main surface of the piezoelectric substrate, wherein
the piezoelectric substrate has a semiconductor layer partially formed by depositing semiconductor on the other main surface thereof and,
wherein an isolated region of the semiconductor layer is formed opposed to the input electrode section and/or to the output electrode section on the other main surface, the isolated region being electrically insulated from other sections of the semiconductor layer.

* * * * *